United States Patent
Okumura

(10) Patent No.: US 7,015,565 B2
(45) Date of Patent: Mar. 21, 2006

(54) GALLIUM NITRIDE TYPE SEMICONDUCTOR LASER DEVICE

(75) Inventor: Toshiyuki Okumura, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/856,184

(22) Filed: May 27, 2004

(65) Prior Publication Data

US 2004/0217371 A1 Nov. 4, 2004

Related U.S. Application Data

(63) Continuation of application No. 10/219,165, filed on Aug. 13, 2002, now Pat. No. 6,764,870, which is a continuation of application No. 09/235,145, filed on Jan. 21, 1999, now Pat. No. 6,456,640.

(30) Foreign Application Priority Data

Jan. 26, 1998 (JP) ................................. 10-012238

(51) Int. Cl.
*H01L 29/201* (2006.01)
*H01S 5/00* (2006.01)

(52) U.S. Cl. .............................. 257/615; 257/E33.023; 372/45.01; 372/46.01

(58) Field of Classification Search ................ 257/200, 257/201, 615, 622, 623, E33.023; 372/44, 372/45, 46
See application file for complete search history.

(56) References Cited

U.S. PATENT DOCUMENTS

| | | | |
|---|---|---|---|
| 5,966,396 A | 10/1999 | Okazaki et al. | |
| 5,970,080 A | 10/1999 | Hata | |
| 5,987,048 A * | 11/1999 | Ishikawa et al. | ............... 372/46 |
| 6,031,858 A | 2/2000 | Hatakoshi et al. | |
| 6,072,818 A | 6/2000 | Hayakawa | |
| 6,072,819 A | 6/2000 | Shakuda | |
| 6,282,220 B1 | 8/2001 | Floyd | |
| 6,456,640 B1 | 9/2002 | Okumura | |
| 6,764,870 B1 | 7/2004 | Okumura | |

FOREIGN PATENT DOCUMENTS

| | | |
|---|---|---|
| JP | 9-191160 | 7/1997 |
| JP | 9-232680 | 9/1997 |
| JP | 9-266352 | 10/1997 |
| JP | 10-163571 | 6/1998 |

OTHER PUBLICATIONS

Nakamura, S. (1997). "Characteristics of Room Temperature—CW Operated InGaN Multi-Quantum-Well-Structure Laser Diodes," *Nitride Semicond. Res* vol. 2, Article 5.

* cited by examiner

*Primary Examiner*—Stephen W. Smoot
(74) *Attorney, Agent, or Firm*—Morrison & Foerster LLP

(57) ABSTRACT

A gallium nitride type semiconductor laser device includes: a substrate; and a layered structure formed on the substrate. The layered structure at least includes an active layer of a nitride type semiconductor material which is interposed between a pair of nitride type semiconductor layers each functioning as a cladding layer or a guide layer. A current is injected into a stripe region in the layered structure having a width smaller than a width of the active layer. The width of the stripe region is in a range between about 0.2 $\mu$m and about 1.8 $\mu$m.

6 Claims, 6 Drawing Sheets

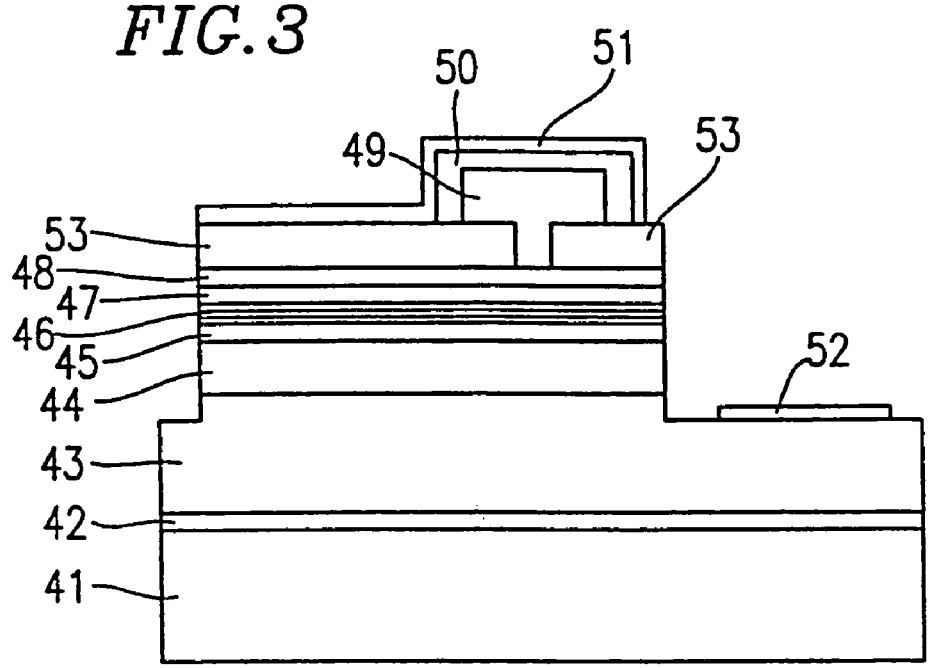
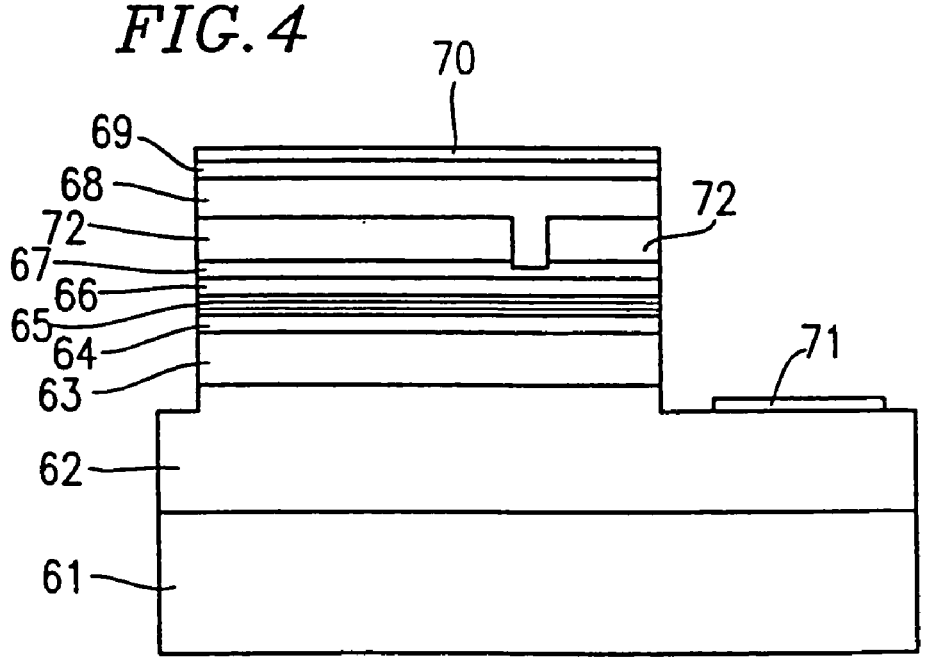

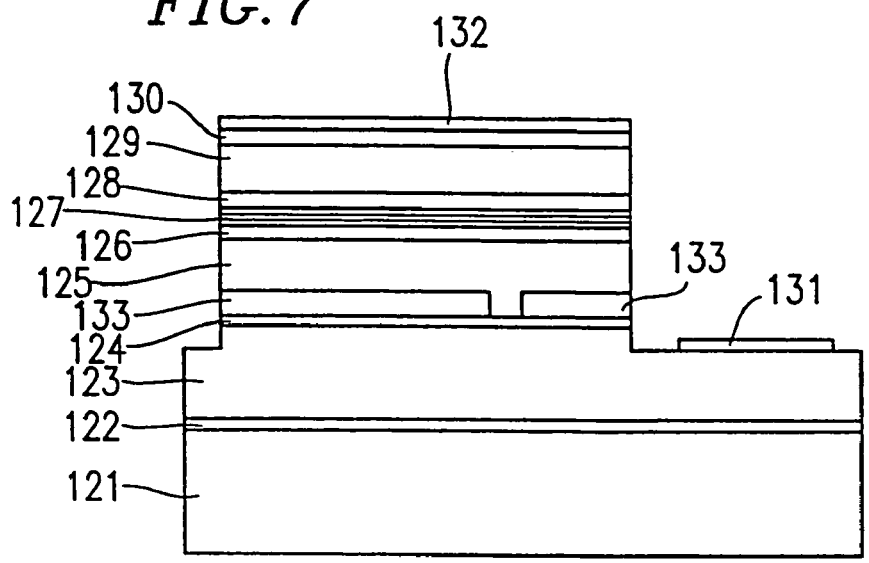
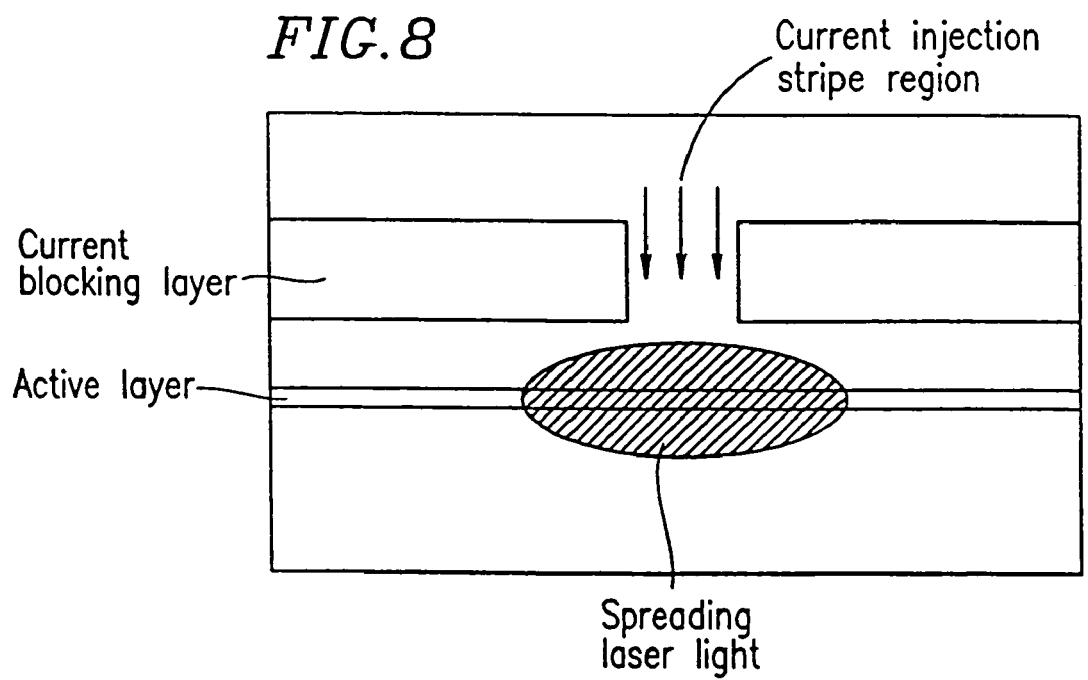

US 7,015,565 B2

GALLIUM NITRIDE TYPE SEMICONDUCTOR LASER DEVICE

CROSS-REFERENCE TO RELATED APPLICATIONS

This application is a continuation of U.S. patent application Ser. No. 10/219,165, filed on Aug. 13, 2002, now U.S. Pat. No. 6,764,870, which is a continuation of U.S. patent application Ser. No. 09/235,145, filed on Jan. 21, 1999, now U.S. Pat. No. 6,456,640 and which claims priority to Japanese Application No. 10-012238, filed on Jan. 26, 1998, the contents of each of which are incorporated herein by reference in their entirety.

BACKGROUND OF THE INVENTION

1. Field of the Invention

The present invention relates to a gallium nitride type semiconductor laser device for use in a light source of an optical disk system.

2. Description of the Related Art

A gallium nitride type semiconductor (e.g., GaInAlN) is used as a semiconductor material for a semiconductor laser device (LD) having an emission wavelength in a wavelength range from ultraviolet to green. For example, MRS Internet J. Nitride Semicond. Res., vol.2, no.5 (1997) describes a semiconductor laser device using such a gallium nitride type semiconductor, as illustrated in a cross-sectional view in FIG. 11.

Referring to FIG. 11, the semiconductor laser device has, on a sapphire substrate 201, a GaN buffer layer 202, an n-GaN contact layer 203, an n-$In_{0.05}Ga_{0.95}N$ layer 204, an n-$Al_{0.08}Ga_{0.92}N$ cladding layer 205, an n-GaN guide layer 206, a multiquantum well structure active layer 207 including $In_{0.15}Ga_{0.85}N$ quantum well layers and $In_{0.02}Ga_{0.98}N$ barrier layers, a p-$Al_{0.2}Ga_{0.8}N$ layer 208, a p-GaN guide layer 209, a p-$Al_{0.08}Ga_{0.92}N$ cladding layer 210, a p-GaN contact layer 211, a p-side electrode 212 and an n-side electrode 213. The multiquantum well structure active layer 207 includes seven layers in total, i.e., four $In_{0.05}Ga_{0.85}N$ quantum well layers each having a thickness of about 3.5 nm and three $In_{0.02}Ga_{0.98}N$ barrier layers each having a thickness of about 7 nm. In the multi-quantum well structure active layer 207, the quantum well layers and the barrier layers alternate with each other.

In this conventional example, the p-$Al_{0.08}Ga_{0.92}N$ cladding layer 210 and the p-GaN contact layer 211 are formed in a ridge stripe pattern so as to constrict an injected current. The width of the stripe pattern is about 4 $\mu$m.

Japanese Laid-open Publication No. 9-232680 describes a semiconductor laser device similarly using a gallium nitride type semiconductor, which also includes a ridge stripe structure having a stripe width of about 5 $\mu$m to about 10 $\mu$m for constricting an injected current.

When employing a semiconductor laser device using a gallium nitride type semiconductor as a light source of an optical disk system, in order to prevent a read error from occurring due to noise during a data read operation, a self-pulsation type semiconductor laser is employed in which an optical output is modulated for a constant current injected. Such a semiconductor laser device is described in Japanese Laid-open Publication No. 9-191160, for example.

FIG. 12 is a cross-sectional view illustrating such a semiconductor laser device. Referring to FIG. 12, the semiconductor laser device includes an n-SiC substrate 221, an n-AlN buffer layer 222, an n-$Al_{0.15}Ga_{0.85}N$ cladding layer 223, an $In_{0.15}Ga_{0.85}N$ active layer 224 having a thickness of about 50 nm, a p-$Al_{0.15}Ga_{0.85}N$ first p-type cladding layer 225, a p-$In_{0.25}Ga_{0.75}N$ saturable absorbing layer 226, an n-$Al_{0.25}Ga_{0.75}N$ current blocking layer 227, a p-$Al_{0.15}Ga_{0.85}N$ second p-type cladding layer 228, a p-GaN cap layer 229, a p-GaN contact layer 230, a p-side electrode 231 and an n-side electrode 232.

In this conventional example, a portion of light generated by the active layer 224 is absorbed by the saturable absorbing layer 226, thereby causing an absorption coefficient of the saturable absorbing layer 226 to change. Accordingly, an intensity of light emission by a laser oscillation from the active layer 224 is changed periodically. As a result, coherence of the emitted light from the laser is reduced. This conventional example also includes a ridge stripe structure having a stripe width of about 2 $\mu$m for constricting an injected current.

When employing such a semiconductor laser device with reduced coherence as a light source of an optical disk system, even if light reflected by the disk returns to the semiconductor laser, the emitted light from the laser does not interfere with the reflected return light, thereby suppressing generation of noise and thus preventing a data read error from occurring.

However, the conventional laser device using a gallium nitride type semiconductor has the following problems.

First, in the self-pulsation type semiconductor laser device having the saturable absorbing layer, light generated by the active layer is absorbed by the saturable absorbing layer, thereby increasing the loss of light within the laser cavity. As a result, the oscillation threshold current of the semiconductor laser device increases, and the emission efficiency is reduced. Moreover, in this conventional self-pulsation type semiconductor laser device, since the saturable absorbing layer is added only to one of the cladding layers interposing the active layer therebetween or only to one of the guide layers interposing the active layer therebetween, the far field pattern of the emitted light from the laser is asymmetric, whereby the focused spot size cannot be made sufficiently small when focusing the emitted light with a lens.

The conventional laser device using a gallium nitride type semiconductor to which the saturable absorbing layer is not added does not have such problems (e.g., the increased oscillation threshold current, the reduced emission efficiency, and incapability to have a small focused spot size) as those seen in the conventional self-pulsation type semiconductor laser device. However, when this semiconductor laser device is used as a light source of an optical disk system, noise occurs due to the return light from the disk, thereby causing a read error during a data read operation. Therefore, the conventional laser device using a gallium nitride type semiconductor to which the saturable absorbing layer is not added is not suitable for a light source of an optical disk system.

SUMMARY OF THE INVENTION

A gallium nitride type semiconductor laser device of the present invention includes: a substrate; and a layered structure formed on the substrate. The layered structure at least includes an active layer of a nitride type semiconductor material which is interposed between a pair of nitride type semiconductor layers each functioning as a cladding layer or a guide layer. A current is injected into a stripe region in the layered structure having a width smaller than a width of the active layer. The width of the stripe region is in a range between about 0.2 µm and about 1.8 µm.

Preferably, a portion of the active layer existing outside the stripe region has a width of at least about 3 µm.

The active layer may include a single quantum well layer.

Alternatively, the active layer may include a multiquantum well structure including a plurality of quantum well layers and at least one barrier layer each interposed between the adjacent two quantum well layers, the number of the quantum well layers being two, three or four.

A thickness of each quantum well layer in the active layer may be about 10 nm or less.

A thickness of each of the at least one barrier layer in the active layer may be about 10 nm or less.

In one embodiment, the layered structure at least includes a first cladding layer having a first conductivity type, the active layer, a second cladding layer having a second conductivity type, and a contact layer having the second conductivity type, which are deposited in this order. The second cladding layer and the contact layer are formed in a stripe having a width smaller than the width of the active layer. And the layered structure further includes a current blocking layer deposited outside the stripe.

In another embodiment, the layered structure at least includes a first cladding layer having a first conductivity type, the active layer, a guide layer or a second cladding layer having a second conductivity type, and a current blocking layer. A striped groove is provided in the current blocking layer so as to reach the guide layer or the second cladding layer having the second conductivity type, the groove having a width smaller than the width of the active layer. And the layered structure further includes at least another cladding layer having the second conductivity type and a contact layer having the second conductivity type which are deposited in this order in the striped groove and on the current blocking layer.

In still another embodiment, the layered structure at least includes a contact layer or a cladding layer having a first conductivity type, and a current blocking layer, which are deposited in this order. A stripe groove is provided in the current blocking layer so as to reach the contact layer or the cladding layer having the first conductivity type. And the layered structure further includes at least another cladding layer having the first conductivity type, the active layer, a cladding layer having a second conductivity type, and a contact layer having the second conductivity type, which are deposited in this order in the striped groove and on the current blocking layer.

The current blocking layer may include a dielectric insulation film.

The current blocking layer may be made of a semiconductor material having an energy gap which is equal to or smaller than an energy gap of the active layer.

The current blocking layer may be made of a semiconductor material having a refractive index which is less than or equal to a refractive index of the cladding layer having the second conductivity.

For example, the current blocking layer may be made of a nitride type semiconductor material.

A thickness of a gallium nitride type semiconductor layer included in the layered structure and interposed between a portion of the active layer outside the stripe region and the current blocking layer may be in a range between about 0.01 µm and about 0.8 µm.

Thus, the invention described herein makes possible the advantage of providing a gallium nitride type semiconductor laser device which solves the above-described problems associated with the conventional gallium nitride type semiconductor laser devices, and which is therefore suitably used as a light source of an optical disk system with satisfactory laser oscillation characteristics.

This and other advantages of the present invention will become apparent to those skilled in the art upon reading and understanding the following detailed description with reference to the accompanying figures.

BRIEF DESCRIPTION OF THE DRAWINGS

FIG. 3 is a cross-sectional view illustrating a semiconductor laser device according to Example 5 of the present invention;

FIG. 4 is a cross-sectional view illustrating a semiconductor laser device according to Example 6 of the present invention;

FIG. 7 is a cross-sectional view illustrating a semiconductor laser device according to Example 9 of the present invention;

FIG. 8 is a cross-sectional view illustrating a semiconductor laser device of the present invention in which a width of a current injection stripe region is less than that of a conventional device;

DESCRIPTION OF THE PREFERRED EMBODIMENTS

In order to achieve the present invention, the inventor has conducted intensive study to find solutions for the above-described problems associated with the conventional devices, and found that a self-pulsation type semiconductor laser device can be realized in a simple structure without a saturable absorbing layer which is used in the conventional self-pulsation type semiconductor laser devices.

A gallium nitride type semiconductor laser device according to the present invention has an active layer of a nitride semiconductor interposed between cladding layer and/or guide layers of a nitride semiconductor. The semiconductor laser device includes a "current injection stripe region" (a stripe region into which a current is injected) having a width less than the width of the active layer. The width of the stripe region is in a range between about 0.2 μm to about 1.8 μm.

FIG. 8 is a cross-sectional view illustrating a semiconductor laser device in which the width of the current injection stripe region is less than that of the conventional gallium nitride type semiconductor laser device. In this case, since the stripe region is narrow, the lateral mode of the laser light is wider than the width of the current injection stripe region. Then, the laser light existing in a region outside the stripe region can be absorbed by a portion of the active layer which exists in the region. Therefore, the portion of the active layer which exists outside the current injection stripe region functions as a saturable absorbing layer, thereby providing self-pulsation characteristics.

When the width of the current injection stripe region is large as in the conventional gallium nitride type semiconductor laser device, the area outside the stripe region where the laser light exists is small, thereby resulting in only a reduced saturable absorbing function thereof. Therefore, the self-pulsation characteristic is not obtained.

According to the present invention, there is a slight increase in the oscillation threshold current density because the laser light is absorbed in a portion of the active layer outside the current injection stripe region. However, the oscillation threshold current value itself is not increased since the width of the current injection stripe region is reduced, thereby obtaining a gallium nitride type semiconductor laser device having satisfactory laser oscillation characteristics.

Figure 9:
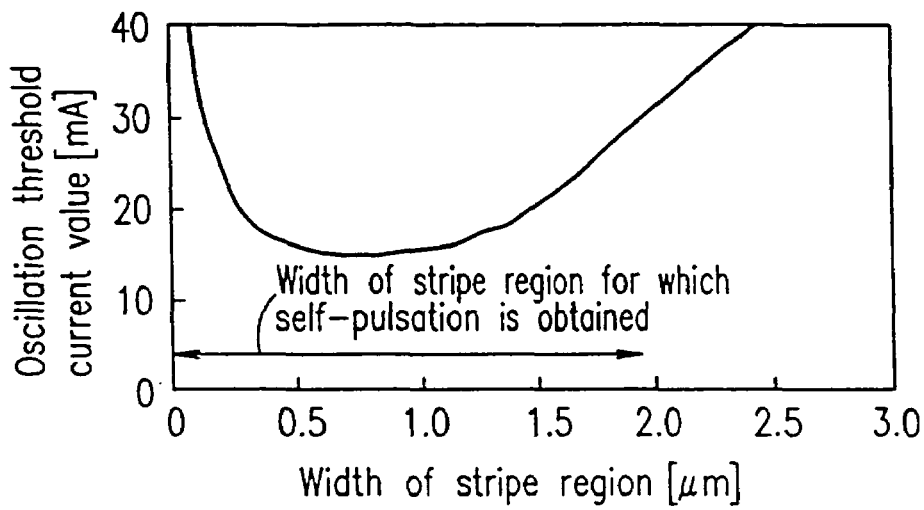
FIG. 9 is a graph illustrating how an oscillation threshold current value changes as a width of a current injection stripe region is varied.

FIG. 9 is a graph illustrating how the oscillation threshold current value changes as the width of the current injection stripe region is varied. FIG. 9 shows that the self-pulsation characteristic is not obtained for a width of the stripe region of about 2 μm or greater where the width of the current injection stripe region is increased, and the oscillation threshold current value is also increased. Moreover, when the width of the current injection stripe region is less than about 0.2 μm, the oscillation threshold current density is substantially increased, thereby increasing the oscillation threshold current value itself. Thus, it is possible to obtain a gallium nitride type semiconductor laser device exhibiting self-pulsation characteristics with a low oscillation threshold current value and satisfactory laser oscillation characteristics by designing the width of the current injection stripe region to be in a range between about 0.2 μm and about 1.8 μm.

Thus, for the portion of the active layer outside the current injection stripe region to function as a saturable absorbing layer, the portion preferably has a width of at least about 3 μm. When the width of the portion is less than about 3 μm, there is only a reduced saturable absorbing effect, and the self-pulsation is not obtained.

When the width of the current injection stripe region is reduced as in the present invention, and a material such as a gallium arsenide type semiconductor material (AlGaAs) or an indium phosphide type semi-conductor material (InGaAsP) is used, the threshold current may increase because of a current being injected into a region larger than the width of the stripe. However, it has been found that when a gallium nitride type semiconductor is used, there is little current spreading since the electric resistance value is large. Thus, the threshold current is small, and the lateral mode of the laser light is stable at the width of the current injection region.

Moreover, when a gallium nitride type semiconductor layer is used, the current spreading is little even when the stripe width is reduced, it is possible to have a relatively thick gallium nitride type semiconductor layer between the portion of the active layer outside the current injection stripe region and a current blocking layer. Therefore, it is not necessary to precisely control the thickness of that gallium nitride type semiconductor layer, thereby improving the production yield.

However, if the thickness of the gallium nitride type semiconductor layer interposed between the portion of the active layer outside the current injection stripe region and the current blocking layer is excessively large, the current spreading out of the stripe region is increased even when using a gallium nitride type semiconductor material having a large electric resistance, whereby the self-pulsation characteristic is not obtained.

Figure 10:
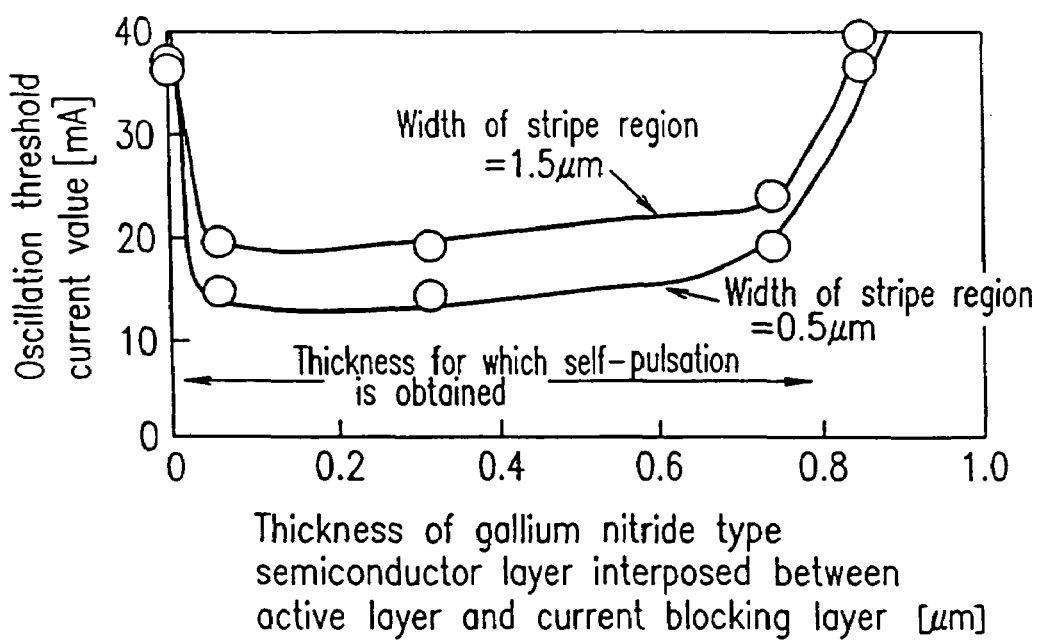
FIG. 10 is a graph illustrating how an oscillation threshold current value changes as a thickness of a gallium nitride type semiconductor layer interposed between a portion of an active layer outside a current injection stripe region and a current blocking layer is varied.
Figure 11:
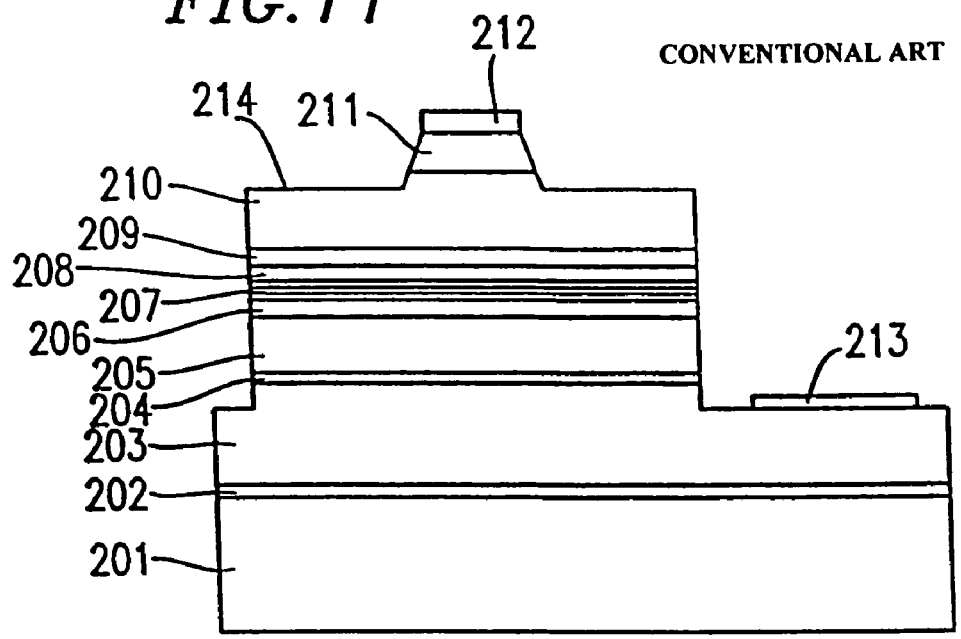
FIG. 11 is a cross-sectional view illustrating a conventional semiconductor laser device using a gallium nitride type semiconductor.
Figure 12:
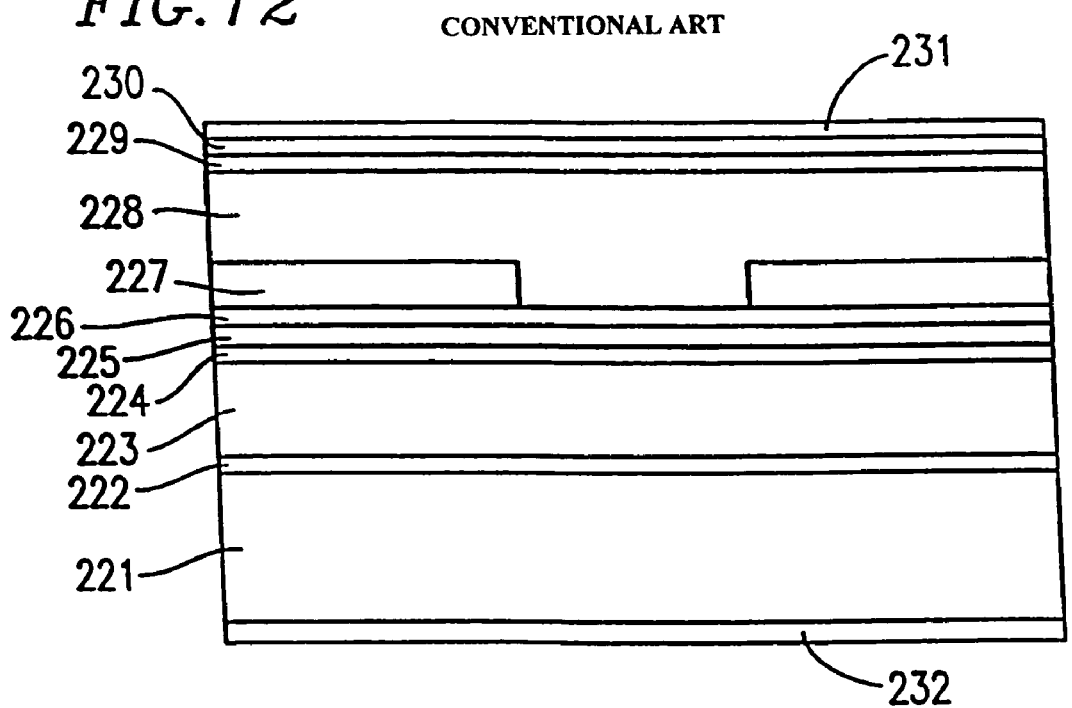
FIG. 12 is a cross-sectional view illustrating a conventional semiconductor laser device of a self-pulsation type using a gallium nitride type semiconductor.

FIG. 10 is a graph illustrating how the oscillation threshold current value changes as the thickness of the gallium nitride type semiconductor layer interposed between the portion of the active layer outside the current injection stripe region and the current blocking layer is varied in the structure of Example 1 which will be described in detail later. FIG. 10 illustrates two cases where the width of the current injection stripe region is about 1.5 μm and about 0.5 μm, respectively.

In either case, the current spreading occurs and the oscillation threshold current value increases when the thickness of the gallium nitride type semiconductor layer (specifically, referring to the total thickness of a p-GaN guide layer 8 and a p-$Al_{0.1}Ga_{0.9}N$ p-type cladding layer 9, see Example 1) is greater than about 0.8 μm. Moreover, when the thickness of the gallium nitride type semiconductor layer is less than about 0.01 μm, the current blocking layer does not function properly, thereby increasing the amount of a leak current and the oscillation threshold current value. Furthermore, it has been confirmed that self-pulsation occurs when the thickness of the gallium nitride type semiconductor layer interposed between the active layer and the current blocking layer is in a range between about 0.01 μm and about 0.8 μm.

Thus, when the thickness of the gallium nitride type semiconductor layer is reduced to be about 0.8 μm or less, the current spreading is suppressed, and there is obtained a gallium nitride type semiconductor laser device having a stable self-pulsation characteristic. Furthermore, when the thickness of the gallium nitride type semiconductor layer is about 0.01 μm or greater, the active layer and the current blocking layer are spatially separated from each other and are allowed to have respective functions thereof separately, whereby there is obtained a gallium nitride type semiconductor laser device having self-pulsation characteristics.

While FIG. 10 illustrates an example where GaN is used for the guide layers and $Al_{0.1}Ga_{0.9}N$ is used for the cladding layers, various devices have been actually produced with guide layers of $Al_xGa_{1-x}N$ ($0 \leq x \leq 0.2$) and cladding layers of $Al_yGa_{1-y}N$ ($0 \leq y \leq 0.3$), where $x \leq y$ (e.g., x=y=0.1; x=0, y=0.3; or x=0.05, Y=0.2). Any of the various devices produced exhibit characteristics substantially the same as those illustrated in FIG. 10. Thus, as long as the compositions of the materials used are within the above ranges, it is possible to reduce the oscillation threshold current value and to provide low noise characteristics resulting from self-pulsation by designing the thickness of the gallium nitride type semiconductor layer interposed between the active layer and the current blocking layer to be in a range between about 0.01 μm and about 0.8 μm. It has also been confirmed that a low oscillation threshold value current can be realized within substantially the same thickness range even when indium (In) is added to the guide layers or the cladding layers in an amount of about 10% or less as the composition of the III group atom.

In order to obtain the self-pulsation type semiconductor laser device of the present invention, densities of electrons and holes existing in the active layer should be rapidly modulated. However, mobilities of electrons or holes of the gallium nitride type semiconductor material used for the active layer are significantly low because of large effective mass of electrons/holes and a large number of crystal defects existing therein. Therefore, even when electrons and holes disappear through emission recombination, new electrons or holes are not injected by diffusion, whereby densities of electrons and holes are less likely to be modulated.

In view of this, in the present invention, the active layer of the gallium nitride type semiconductor laser device is formed in a single quantum well layer or a multiquantum well structure (including quantum well layers and barrier layers formed in an alternate pattern, where the number of the quantum well layers is in a range between 2 and 4), with the thickness of each quantum well layer in the active layer being about 10 nm or less. In this way, electrons and holes are more easily diffused, and densities of electrons and holes are more easily modulated. As a result, there is obtained a gallium nitride type semiconductor laser device having a stable self-pulsation characteristic.

Moreover, in the case where the active layer employs the multiquantum well structure, if the barrier layer in the active layer is excessively thick, uniform distributions of electrons and holes across the active layer are inhibited. Therefore, the electrons and holes are less likely to be re-combined, thereby deteriorating the self-pulsation characteristics. However, by designing the thickness of the barrier layer to be about 10 nm or less, the holes and electrons are distributed uniformly in the active layer, thereby obtaining a gallium nitride type semiconductor laser device having satisfactory self-pulsation characteristics.

Unlike a semiconductor laser device using a material such as a gallium arsenide type semiconductor material (AlGaAs) or an indium phosphide type semiconductor material (InGaAsP), the gallium nitride type semiconductor laser device includes a large number of defects in the current injection stripe region. However, according to the present invention, the number of defects present in the region is reduced by reducing the width of the stripe region, thereby preventing deterioration of the laser characteristics and improving the reliability of the device.

The present invention will now be described in greater detail with reference to illustrative examples.

EXAMPLE 1

Figure 1:
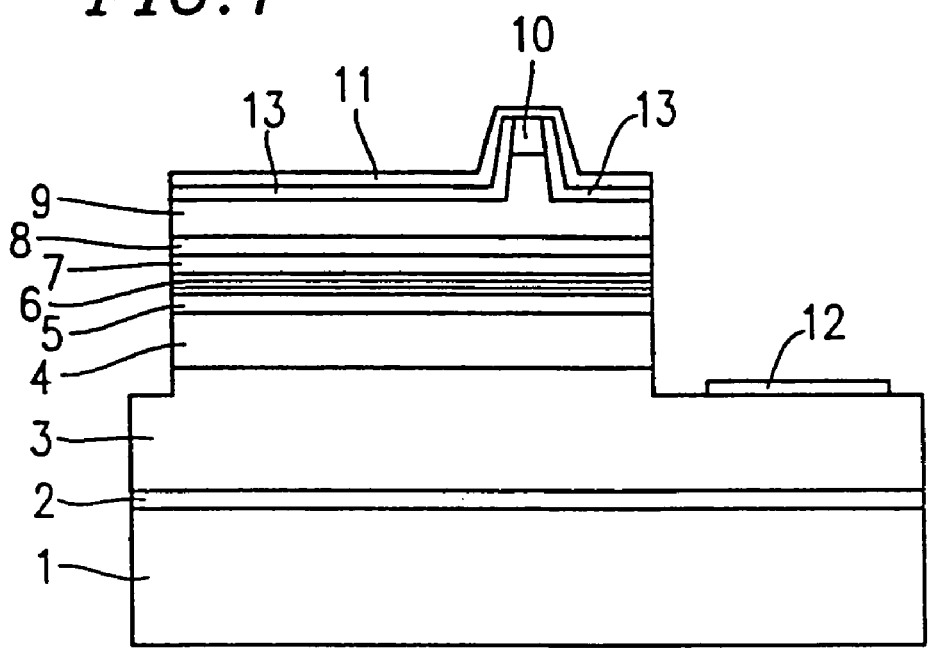
FIG. 1 is a cross-sectional view illustrating a semiconductor laser device according to Example 1 of the present invention.

FIG. 1 is a cross-sectional view illustrating a gallium nitride type semiconductor laser device according to Example 1 of the present invention.

Referring to FIG. 1, the gallium nitride type semiconductor laser device includes a sapphire substrate 1 having a c-plane as a top surface thereof, a GaN buffer layer 2, an n-GaN n-type contact layer 3, an n-$Al_{0.1}Ga_{0.9}N$ n-type cladding layer 4, an n-GaN guide layer 5, a multiquantum well structure active layer 6 including two $In_{0.2}Ga_{0.8}N$ quantum well layers and a single $In_{0.5}Ga_{0.95}N$ barrier layer, an $Al_{0.2}Ga_{0.8}N$ evaporation prevention layer 7, a p-GaN guide layer 8, a p-$Al_{0.1}Ga_{0.9}N$ p-type cladding layer 9, a p-GaN p-type contact layer 10, a p-side electrode 11, an n-side electrode 12 and a $SiO_2$ insulation film 13.

In the present invention, the sapphire substrate 1 may alternatively have any other orientation such as an a-plane, an r-plane or an m-plane. Moreover, a GaN substrate, a SiC substrate, a spinel substrate, a MgO substrate, a Si substrate, a GaAs substrate, or the like, may be used instead of a sapphire substrate. Particularly, a GaN substrate and a SiC substrate are advantageous in that they have a lattice constant which is closer to that of a gallium nitride type semiconductor material deposited thereon, as compared with a sapphire substrate, thereby resulting in a film with good crystallinity. Furthermore, they are relatively easily cleaved, thereby facilitating formation of a laser cavity end face by cleavage.

The buffer layer 2 need not be made of GaN but may alternatively be made of any other material, e.g., AlN or AlGaN ternary mixed crystal as long as a gallium nitride type semiconductor material can be epitaxially grown thereon.

Each of the n-type cladding layer 4 and the p-type cladding layer 9 may alternatively be made of an AlGaN ternary mixed crystal having an Al composition other than $Al_{0.1}Ga_{0.9}N$. When the Al composition is increased, the energy gap difference and the refractive index difference between the active layer and the cladding layers increases, thereby effectively confining carriers and light within the active layer. This allows for reduction of the oscillation threshold current and improvement of the temperature characteristic. Decreasing the Al composition to such an extent that the confinement of carriers and light is maintained increases the mobility of the carriers in the cladding layers, thereby allowing for reduction of the device resistance of the semiconductor laser device. Moreover, each of these cladding layers may alternatively be made of a quaternary mixed crystal semiconductor, or a mixed crystal semiconductor of more than four elements which further contains one or more additional elements in a small amount.

It should be noted that the n-type cladding layer 4 and the p-type cladding layer 9 need not have the same mixed crystal composition.

Each of the guide layers 5 and 8 need not be made of GaN but may alternatively be made of any other material, e.g., an InGaN or AlGaN ternary mixed crystal, an InGaAlN quaternary mixed crystal, or the like, as long as the material has an energy gap value between that of the quantum well layer forming the multiquantum well structure active layer 6 and that of the cladding layers 4 and 9. Moreover, a donor or an acceptor need not be doped entirely across the guide layers. Alternatively, a portion of the guide layers closer to the multiquantum well structure active layer 6 may be non-doped, or the entire guide layers may be non-doped. In such a case, fewer carriers exist in the guide layers, thereby reducing the amount of light absorbed by free carriers and allowing for further reduction of the oscillation threshold current. Furthermore, the guide layer may be optional in some cases, and a gallium nitride type semiconductor laser device without guide layers may still function as a semiconductor laser device.

The respective compositions of the two $In_{0.2}Ga_{0.8}N$ quantum well layers and the single $In_{0.05}Ga_{0.95}N$ barrier layer of the multiquantum well structure active layer 6 may be set to be suitable for the desired laser oscillation wavelength. For example, when a longer oscillation wavelength is desired, the In composition of the quantum well layer may be increased, and when a shorter oscillation wavelength is desired, the In composition of the quantum well layer may be decreased. Furthermore, each of the quantum well layer and the barrier layer may be made of a quaternary mixed crystal semiconductor, or a mixed crystal semiconductor of more than four elements which further contains one or more additional elements in a small amount in addition to the InGaN ternary mixed crystal. The barrier layers may be simply made of GaN.

In the present example, the $Al_{0.2}Ga_{0.8}N$ evaporation prevention layer 7 is formed in contact with the multiquantum well structure active layer 6 in order to prevent evaporation of the quantum well layer while the growth temperature is increased. Therefore, any other material or structure may be used as the evaporation prevention layer 7 as long as it protects the quantum well layer. For example, an AlGaN ternary mixed crystal having a different Al composition or GaN may be used. Moreover, Mg may be doped into the evaporation prevention layer 7. In such a case, the injection of holes through the p-GaN guide layer 8 or the p-$Al_{0.1}Ga_{0.9}N$ p-type cladding layer 9 can be facilitated.

Furthermore, when the In composition of the quantum well layer is relatively small, the quantum well layer is not substantially evaporated even if the evaporation prevention layer 7 is not provided. Thus, even if the evaporation prevention layer 7 is not provided in such a case, the characteristics of the gallium nitride type semiconductor laser device according to the present example will not be lost or deteriorated.

Referring to FIG. 1, a method for producing the above-described gallium nitride type semiconductor laser device will now be described. In the following, an MOCVD method (a metal organic chemical vapor deposition method) is employed. However, any other vapor phase growth method with which GaN can be epitaxially grown may alternatively be used, e.g., an MBE method (molecular beam epitaxial growth method) or an HVPE method (a hydride vapor phase epitaxial growth method).

First, the GaN buffer layer 2 is grown to be about 35 nm in thickness at a growth temperature of about 550° C., using trimethylgallium (TMG) and ammonium ($NH_3$) as source materials, on the sapphire substrate 1 having a c-plane as a top surface thereof which has been positioned in a preselected growth oven.

Then, the growth temperature is increased to about 1050° C., and the Si-doped n-GaN n-type contact layer 3 is grown to be about 3 $\mu$m in thickness, using TMG, $NH_3$ and a silane gas ($SiH_4$) as source materials. Then, trimethylaluminum (TMA) is added to the source materials, and the Si-doped n-$Al_{0.1}Ga_{0.9}N$ n-type cladding layer 4 is grown to be about 0.7 $\mu$m in thickness while maintaining the growth temperature at about 1050° C. Then, TMA is removed from the source materials, and the Si-doped n-GaN guide layer 5 is grown to be about 0.05 $\mu$m in thickness while maintaining the growth temperature at about 1050° C.

Next, the growth temperature is reduced to about 750° C., and an $In_{0.2}Ga_{0.8}N$ quantum well layer (thickness: about 5 nm), an $In_{0.05}Ga_{0.95}N$ barrier layer (thickness: about 5 nm) and another $In_{0.2}Ga_{0.8}N$ quantum well layer (thickness: about 5 nm) are grown in this order, using TMG, $NH_3$ and trimethylindium (TMI) as source materials, thereby providing the multiquantum well structure active layer 6 (total thickness: about 15 nm). Then, the $Al_{0.2}Ga_{0.8}N$ evaporation prevention layer 7 is grown to be about 10 nm in thickness, using TMG, TMA and $NH_3$ as source materials, while maintaining the growth temperature at about 750° C.

Next; the growth temperature is increased again to about 1050° C., and the Mg-doped p-GaN guide layer 8 is grown to be about 0.05 $\mu$m in thickness, using TMG, $NH_3$ and cyclopentadienylmagnesium ($Cp_2Mg$) as source materials.

Then, TMA is added to the source materials, and the Mg-doped p-$Al_{0.1}Ga_{0.9}N$ p-type cladding layer 9 is grown to be about 0.7 $\mu$m in thickness while maintaining the growth temperature at about 1050° C. Then, TMA is removed from the source materials, and the Mg-doped p-GaN p-type contact layer 10 is grown to be about 0.2 $\mu$m in thickness while maintaining the growth temperature at about 1050° C. Thus, a gallium nitride type epitaxial wafer is produced.

Then, the wafer is annealed in a nitrogen gas atmosphere at about 800° C., so as to reduce the resistance of the Mg-doped p-type layers.

Thereafter, using ordinary photolithography and dry etching techniques, an etching process is performed to remove portions of the p-GaN p-type contact layer 10 and the other layers thereunder in a stripe pattern so that the n-GaN n-type contact layer 3 is exposed there-through, thereby forming a mesa structure having a width of about 200 $\mu$m. Next, using the similar photolithography and dry etching techniques, another etching process is performed to remove portions of the remaining p-GaN p-type contact layer 10 and the p-$Al_{0.1}Ga_{0.9}N$ p-type cladding layer 9 so as to form a ridge structure having a width of about 1.5 $\mu$m. The striped ridge structure is preferably separated by about 3 $\mu$m or more from each side of the mesa structure having a width of about 200 $\mu$m. In the present example, the striped ridge structure is provided so as to be separated by about 10 $\mu$m from a side of the mesa structure on which the n-side electrode 12 is formed. When the striped ridge structure is thus provided close to the n-side electrode 12 as in this example, the electric resistance and thus the operating voltage is reduced.

During the dry etching process, the etching is stopped before reaching the multiquantum well structure active layer 6 so as to suppress damage to the active layer due to the etching, thereby preventing the reliability of the device from decreasing and the oscillation threshold current value from increasing. In addition, in the present example, the portion of the p-$Al_{0.1}Ga_{0.9}N$ p-type cladding layer 9 remaining unetched outside the stripe region has a thickness of about 0.3 $\mu$m. This, even in combination with the p-GaN guide layer 8, is thinner than about 0.8 $\mu$m, thereby suppressing the current spreading.

Then, a $SiO_2$ insulation film 13 having a thickness of about 200 nm is formed as a current blocking layer on the side surfaces of the ridge and the surface of the p-type layer, except for a portion of the surface where the ridge is provided. The p-side electrode 11 of nickel and gold is formed on the surface of the $SiO_2$ insulation film 13 and the p-GaN p-type contact layer 10. The n-side electrode 12 of titanium and aluminum is formed on the surface of the n-GaN n-type contact layer 3 which has been exposed by the etching process. Thus, a gallium nitride type LD wafer is produced.

Then, the wafer is cleaved along a direction perpendicular to the direction of the ridge stripe so as to provide laser cavity end faces. Each of the cleaved wafer pieces is further divided into individual chips. Each chip is mounted on a stem, and the electrodes are respectively connected to lead terminals by wire bonding, thereby producing a gallium nitride type semiconductor laser device.

The produced semiconductor laser device exhibits good laser characteristics, e.g., an oscillation wave-length of about 410 nm and an oscillation threshold current of about 20 mA. Moreover, deterioration is not observed in these characteristics, and it is confirmed that the device effects self-pulsation. When the gallium nitride type semiconductor laser device of this example is used in an optical disk system, a data read error is prevented.

Thus, there is provided a gallium nitride type semiconductor laser device which can be put into practical use.

In the present example, the width of the current injection stripe region is about 1.5 µm. However, substantially the same effect can be achieved with any other width of the stripe region in a range between about 0.2 µm and about 1.8 µm.

In the present example, each of the quantum well layers and the barrier layer of the multiquantum well structure active layer 6 has a thickness of about 5 nm. However, these layers need not have the same thickness but may alternatively have different thicknesses. Moreover, substantially the same effect can be achieved as long as each of these layers has a thickness of about 10 nm or less. Furthermore, the multiquantum well structure active layer 6 may alternatively include three or four quantum well layers, or it may alternatively be a single quantum well layer structure active layer.

In the present example, the laser cavity end faces are provided by cleavage. However, a sapphire substrate may sometimes be so hard that it is difficult to be cleaved. In such a case, the laser cavity end faces may alternatively be provided by a dry etching process.

Moreover, since a sapphire substrate, which is an insulator, is used in the present example, the n-side electrode 12 is formed on the surface of the n-GaN n-type contact layer 3 which has been exposed by the etching process. Alternatively, when GaN, SiC, Si, GaAs, or the like, having the n-type conductivity, is used for the substrate, the n-side electrode 12 may be formed on the reverse side of the substrate. In such a case, the etching process for producing a striped mesa structure having a width of about 200 µm may be optional, and the striped ridge structure into which a current is injected may be separated by about 3 µm or more from each end of the semiconductor laser device chip.

Moreover, the p-type and n-type conductivities may be reversed in the above explanation.

EXAMPLE 2

Figure 2:
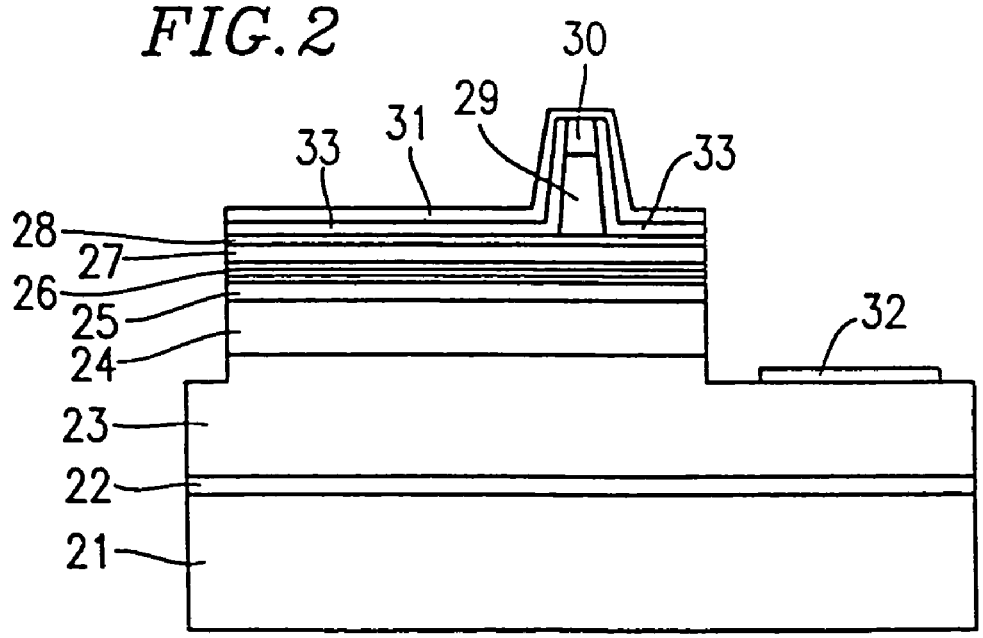
FIG. 2 is a cross-sectional view illustrating a semiconductor laser device according to Example 2 of the present invention.

FIG. 2 is a cross-sectional view illustrating a gallium nitride type semiconductor laser device according to Example 2 of the present invention.

Referring to FIG. 2, the gallium nitride type semiconductor laser device includes a sapphire substrate 21 having a c-plane as a top surface thereof, a GaN buffer layer 22, an n-GaN n-type contact layer 23, an n-$Al_{0.1}Ga_{0.9}N$ n-type cladding layer 24, an n-GaN guide layer 25, a multiquantum well structure active layer 26 including two $In_{0.2}Ga_{0.8}N$ quantum well layers and three $In_{0.05}Ga_{0.95}N$ barrier layers, a p-GaN guide layer 27, a p-$In_{0.05}Ga_{0.95}N$ etching stopping layer 28, a p-$Al_{0.1}Ga_{0.9}N$ p-type cladding layer 29, a p-GaN p-type contact layer 30, a p-side electrode 31, an n-side electrode 32 and a $SiO_2$ insulation film 33.

In the present example, since the $In_{0.05}Ga_{0.95}N$ barrier layer which has a low In composition is provided as the top layer of the multiquantum well structure active layer 26, the $Al_{0.2}Ga_{0.8}N$ evaporation prevention layer is not deposited. Moreover, the p-$In_{0.05}Ga_{0.95}N$ etching stopping layer 28 is deposited on the p-GaN guide layer 27. Other than the above, the gallium nitride type semiconductor laser device is produced in substantially the same manner as in Example 1.

Referring to FIG. 2, a method for producing the gallium nitride type semiconductor laser device of the present example will now be described. In the following, an MOCVD method is employed. However, any other vapor phase growth method with which GaN can be epitaxially grown may alternatively be used, e.g., an MBE method or an HVPE method.

First, the GaN buffer layer 22 is grown to be about 35 nm in thickness at a growth temperature of about 550° C., using TMG and $NH_3$ as source materials, on the sapphire substrate 1 having a c-plane as a top surface thereof which has been positioned in a preselected growth oven.

Then, the growth temperature is increased to about 1050° C., and the Si-doped n-GaN n-type contact layer 23 is grown to be about 3 µm in thickness, using TMG, $NH_3$ and a $SiH_4$ as source materials. Then, TMA is added to the source materials, and the Si-doped n-$Al_{0.1}Ga_{0.9}N$ n-type cladding layer 24 is grown to be about 0.7 µm in thickness while maintaining the growth temperature at about 1050° C. Then, TMA is removed from the source materials, and the Si-doped n-GaN guide layer 25 is grown to be about 0.05 µm in thickness while maintaining the growth temperature at about 1050° C.

Next, the growth temperature is reduced to about 750° C., and an $In_{0.05}Ga_{0.95}N$ barrier layer (thickness: about 5 nm) an $In_{0.2}Ga_{0.8}N$ quantum well layer (thickness: about 5 nm), an $In_{0.05}Ga_{0.95}N$ barrier layer (thickness: about 5 nm), an $In_{0.2}Ga_{0.8}N$ quantum well layer (thickness: about 5 nm) and an $In_{0.05}Ga_{0.95}N$ barrier layer (thickness: about 5 nm) are grown in this order, using TMG, $NH_3$ and TMI as source materials, thereby providing the multiquantum well structure active layer 26 (total thickness: about 25 nm).

Next, the growth temperature is increased again to about 1050° C., and the Mg-doped p-GaN guide layer 27 is grown to be about 0.05 µm in thickness, using TMG, $NH_3$ and $Cp_2Mg$ as source materials. Then, the growth temperature is reduced to about 750° C., and the p-$In_{0.05}Ga_{0.95}N$ etching stopping layer 28 is grown to be about 0.02 µm in thickness, using TMG, $NH_3$, $Cp_2Mg$ and TMI as source materials.

Then, the growth temperature is increased again to about 1050° C., and the Mg-doped p-$Al_{0.1}Ga_{0.9}N$ p-type cladding layer 29 is grown to be about 0.7 µm in thickness, using TMG, $NH_3$, $Cp_2Mg$ and TMA as source materials. Then, TMA is removed from the source materials, and the Mg-doped p-GaN p-type contact layer 30 is grown to be about 0.2 µm in thickness while maintaining the growth temperature at about 1050° C. Thus, a gallium nitride type epitaxial wafer is produced.

Then, the wafer is annealed in a nitrogen gas atmosphere at about 800° C., so as to reduce the resistance of the Mg-doped p-type layers.

Thereafter, using ordinary photolithography and dry etching techniques, an etching process is performed to remove portions of the p-GaN p-type contact layer 30 and the other layers thereunder in a stripe pattern so that the n-GaN n-type contact layer 23 is exposed, thereby forming a mesa structure having a width of about 200 µm. Next, using the similar photolithography and dry etching techniques, another etching process is performed to remove portions of the remaining p-GaN p-type contact layer 30 and the p-$Al_{0.1}Ga_{0.9}N$ p-type cladding layer 29 so as to form a ridge structure having a width of about 1.5 µm. In this process, In atoms appear on the exposed surface when the etching reaches the p-$In_{0.05}Ga_{0.95}N$ etching stopping layer 28. Thus, the etching process can be stopped upon detection of the In atoms by element analysis, thereby precisely controlling the etching depth. The striped ridge structure is provided so as to be separated by about 10 µm from a side of the mesa structure on which the n-side electrode 32 is formed.

Then, a $SiO_2$ insulation film 33 having a thickness of about 200 nm is formed as a current blocking layer on the side surfaces of the ridge and the surface of the p-type layer, except for a portion of the surface where the ridge is provided. The p-side electrode 31 of nickel and gold is formed on the surface of the $SiO_2$ insulation film 33 and the p-GaN p-type contact layer 30. The n-side electrode 32 of titanium and aluminum is formed on the surface of the n-GaN n-type contact layer 23 which has been exposed by the etching process. Thus, a gallium nitride type LD wafer is produced.

Then, the wafer is cleaved along a direction perpendicular to the direction of the ridge stripe so as to provide laser cavity end faces, and each of the cleaved wafer pieces is further divided into individual chips. Each chip is mounted on a stem, and the electrodes are respectively connected to lead terminals by wire bonding, thereby producing a gallium nitride type semiconductor laser device.

The produced semiconductor laser device exhibits good laser characteristics, e.g., an oscillation wavelength of about 410 nm and an oscillation threshold current of about 20 mA, as in Example 1. Moreover, deterioration is not observed in these characteristics, and it is confirmed that the device effects self-pulsation. When the gallium nitride type semiconductor laser device of this example is used in an optical disk system, a data read error is prevented.

Thus, there is provided a gallium nitride type semiconductor laser device which can be put into practical use. Moreover, the use of the etching stopping layer improves the controllability of the etching depth, thereby reducing device characteristic variation among different production lots.

In the present example, the width of the current injection stripe region is about 1.5 μm. However, substantially the same effect can be achieved with any other width of the stripe region in a range between about 0.2 μm and about 1.8 μm.

In the present example, each of the quantum well layers and the barrier layers of the multiquantum well structure active layer 26 has a thickness of about 5 nm. However, these layers need not have the same thickness but may alternatively have different thicknesses. Moreover, substantially the same effect can be achieved as long as each of these layers has a thickness of about 10 nm or less. Furthermore, the multiquantum well structure active layer 26 may alternatively include three or four quantum well layers, or it may alternatively be a single quantum well layer structure active layer.

In the present example, the laser cavity end faces are provided by cleavage. However, a sapphire substrate may sometimes be so hard that it is difficult to be cleaved. In such a case, the laser cavity end faces may alternatively be provided by a dry etching process.

Moreover, since a sapphire substrate, which is an insulator, is used in the present example, the n-side electrode 32 is formed on the surface of the n-GaN n-type contact layer 23 which has been exposed by the etching process. Alternatively, when GaN, SiC, Si, GaAs, or the like, having the n-type conductivity, is used for the substrate, the n-side electrode 32 may be formed on the reverse side of the substrate. In such a case, the etching process for producing a striped mesa structure having a width of about 200 μm is optional, and the striped ridge structure into which a current is injected may be separated by about 3 μm or more from each end of the semiconductor laser device chip.

Moreover, the p-type and n-type conductivities may be reversed in the above explanation.

In the present example, the p-$In_{0.05}Ga_{0.95}N$ etching stopping layer 28 is deposited on the p-GaN guide layer 27. Alternatively, the p-$In_{0.05}Ga_{0.95}N$ etching stopping layer 28 may be provided in the p-GaN guide layer 27 or in the p-$Al_{0.1}Ga_{0.9}N$ p-type cladding layer 29. Moreover, the In composition of the p-$In_{0.05}Ga_{0.95}N$ etching stopping layer 28 is not limited to that described in the present example. Any other semiconductor material may alternatively be used as long as it allows for determination of the etching depth.

EXAMPLE 3

A gallium nitride type semiconductor laser device according to Example 3 of the present example is produced in substantially the same manner as that in Example 2 except that a Si-doped n-$In_{0.25}Ga_{0.75}N$ layer having a thickness of about 0.5 μm is provided as a current blocking layer on the side surfaces of the striped ridge structure into which a current is injected and the surface of the p-type layer, except for a portion of the surface where the ridge is provided.

The produced semiconductor laser device exhibits good laser characteristics, e.g., an oscillation wavelength of about 410 nm and an oscillation threshold current of about 20 mA. Moreover, deterioration is not observed in these characteristics, and it is confirmed that the device effects self-pulsation.

In the present example, since light generated by the active layer is absorbed by the Si-doped n-$In_{0.25}Ga_{0.75}N$ current blocking layer provided outside the current injection stripe region, the spreading of the lateral mode of the laser light is stabilized due to the light absorption by the current blocking layer, thereby allowing laser light of a single lateral mode to be obtained with good reproducibility.

Moreover, the current blocking layer has the n-type conductivity in the present example. Holes as minority carriers generated by the light absorption in the current blocking layer have a short diffusion length and disappear quickly, and therefore will not flow through the current blocking layer into the p-type cladding layer. Therefore, when a light-absorbing semiconductor material is used as a current blocking layer, it preferably has n-type conductivity.

In the present example, the Si-doped n-$In_{0.25}Ga_{0.75}N$ layer (about 2.9 eV) is used as a current blocking layer. Alternatively, any other semiconductor may be used as long as it has an energy gap less than or equal to that of the active layer (about 3.1 eV). For example, an InGaN ternary mixed crystal nitride semiconductor having a different In composition, an AlGaInN quaternary mixed crystal nitride semiconductor, or a semiconductor other than a nitride semiconductor such as a gallium arsenide type semiconductor, an indium phosphide type semiconductor, a II–VI group semiconductor, a IV group semiconductor, or the like, may be used. However, when a gallium nitride type semiconductor is used for a current blocking layer, the thermal expansion coefficient, the lattice constant and the crystalline structure thereof are similar to those of the other gallium nitride type semiconductors used for the active layer or the cladding layer. Thus, a current blocking layer having a good crystallinity can be formed, thereby improving the reliability of the laser device.

EXAMPLE 4

A gallium nitride type semiconductor laser device according to Example 4 of the present example is produced in substantially the same manner as that in Example 2 except that a Si-doped n-$Al_{0.25}Ga_{0.75}N$ layer having a thickness of about 0.5 μm is provided as a current blocking layer on the side surfaces of each of the striped ridge structures into which a current is injected and the surface of the p-type layer, except for a portion of the surface where the ridge is provided.

The produced semiconductor laser device exhibits good laser characteristics, e.g., an oscillation wavelength of about 410 nm and an oscillation threshold current of about 18 mA. Moreover, deterioration is not observed in these characteristics, and it is confirmed that the device effects self-pulsation.

In the present example, the refractive index (about 2.43) of the Si-doped n-$Al_{0.25}Ga_{0.75}N$ current blocking layer provided outside the current injection stripe region is smaller than the refractive index (about 2.49) of the Mg-doped p-$Al_{0.1}Ga_{0.9}N$ p-type cladding layer. Therefore, the effective refractive index inside the stripe region is larger than that outside the stripe region, so that the spreading of the lateral mode of the laser light is stabilized due to the refractive index difference. This allows laser light of a single lateral mode to be obtained with good reproducibility. Furthermore, the Si-doped n-$Al_{0.25}Ga_{0.75}N$ current blocking layer does not absorb light generated by the active layer, thereby allowing for further reduction of the oscillation threshold current value.

In the present example, the Si-doped n-$Al_{0.25}Ga_{0.75}N$ layer is used as a current blocking layer. Alternatively, any other semiconductor may be used as long as it has a refractive index less than or equal to that of the Mg-doped p-$Al_{0.1}Ga_{0.9}N$ p-type cladding layer. For example, an AlGaN ternary mixed crystal nitride semiconductor having a different Al composition, an AlGaInN quaternary mixed crystal nitride semiconductor, or a semiconductor other than a nitride semiconductor may be used. However, when a gallium nitride type semiconductor is used for a current blocking layer, the thermal expansion coefficient, the lattice constant and the crystalline structure thereof are similar to those of the other gallium nitride type semiconductors used for the active layer or the cladding layer. Thus, a current blocking layer having a good crystallinity can be formed, thereby improving the reliability of the laser device.

EXAMPLE 5

FIG. 3 is a cross-sectional view illustrating a gallium nitride type semiconductor laser device according to Example 5 of the present invention.

Referring to FIG. 3, the gallium nitride type semiconductor laser device includes a sapphire substrate 41 having a c face as a surface thereof, a GaN buffer layer 42, an n-GaN n-type contact layer 43, an n-$Al_{0.1}Ga_{0.9}N$ n-type cladding layer 44, an n-GaN guide layer 45, a multiquantum well structure active layer 46 including three $In_{0.2}Ga_{0.8}N$ quantum well layers and two $In_{0.05}Ga_{0.95}N$ barrier layers, an $Al_{0.2}Ga_{0.8}N$ evaporation prevention layer 47, a p-GaN guide layer 48, a p-$Al_{0.1}Ga_{0.9}N$ p-type cladding layer 49, a p-GaN p-type contact layer 50, a p-side electrode 51, an n-side electrode 52 and a $SiO_2$ insulation film 53.

In the present invention, the sapphire substrate 41 may alternatively have any other orientation such as an a-plane, an r-plane or an m-plane. Moreover, a GaN substrate, a SiC substrate, a spinel substrate, a MgO substrate, a Si substrate, a GaAs substrate, or the like, may be used instead of a sapphire substrate. Particularly, a GaN substrate and a SiC substrate are advantageous in that they have a lattice constant which is closer to that of a gallium nitride type semiconductor material deposited thereon, as compared to a sapphire substrate, thereby resulting in a film with good crystallinity. Furthermore, they are relatively easily cleaved, thereby facilitating formation of a laser cavity end face by cleavage.

The buffer layer 42 need not be made of GaN but may alternatively be made of any other material, e.g., AlN or AlGaN ternary mixed crystal as long as a gallium nitride type semiconductor material can be epitaxially grown thereon.

Each of the n-type cladding layer 44 and the p-type cladding layer 49 may alternatively be made of an AlGaN ternary mixed crystal having an Al composition other than $Al_{0.1}Ga_{0.9}N$. When the Al composition is increased, the energy gap difference and the refractive index difference between the active layer and the cladding layers increases, thereby effectively confining carriers and light within the active layer. This allows for reduction of the oscillation threshold current and improvement of the temperature characteristic. Decreasing the Al composition to such an extent that the confinement of carriers and light is maintained increases the mobility of the carriers in the cladding layers, thereby allowing for reduction of the device resistance of the semiconductor laser device. Moreover, each of these cladding layers may alternatively be made of a quaternary mixed crystal semiconductor, or a mixed crystal semiconductor of more than four elements which further contains one or more additional elements in a small amount.

It should be noted that the n-type cladding layer 44 and the p-type cladding layer 49 need not have the same mixed crystal composition.

Each of the guide layers 45 and 48 need not be made of GaN but may alternatively be made of any other material, e.g., an InGaN or AlGaN ternary mixed crystal, an InGaAlN quaternary mixed crystal, or the like, as long as the material has an energy gap value between that of the quantum well layer forming the multiquantum well structure active layer 46 and that of the cladding layers 44 and 49. Moreover, a donor or an acceptor need not be doped entirely across the guide layers. Alternatively, a portion of the guide layers closer to the multiquantum well structure active layer 46 may be nondoped, or the entire guide layers may be nondoped. In such a case, fewer carriers exist in the guide layers, thereby reducing the amount of light absorbed by free carriers and allowing for further reduction of the oscillation threshold current.

The respective compositions of the three $In_{0.2}Ga_{0.8}N$ quantum well layers and the two $In_{0.05}Ga_{0.95}N$ barrier layers of the multiquantum well structure active layer 46 may be set to be suitable for the desired laser oscillation wavelength. For example, when a longer oscillation wavelength is desired, the In composition of the quantum well layer may be increased, and when a shorter oscillation wavelength is desired, the In composition of the quantum well layer may be decreased. Furthermore, each of the quantum well layer and the barrier layer may be made of a quaternary mixed crystal semiconductor, or a mixed crystal semiconductor of more than four elements which further contains one or more additional elements in a small amount in addition to the InGaN ternary mixed crystal. The barrier layers may be simply made of GaN.

In the present example, the $Al_{0.2}Ga_{0.8}N$ evaporation prevention layer 47 is formed in contact with the multiquantum well structure active layer 46 in order to prevent evaporation of the quantum well layer while the growth temperature is increased. Therefore, any other material or structure may be used as the evaporation prevention layer 47 as long as it protects the quantum well layer. For example, an AlGaN ternary mixed crystal having a different Al composition or GaN may be used. Moreover, Mg may be doped into the evaporation prevention layer 47. In such a case, the injection of holes through the p-GaN guide layer 48 or the p-$Al_{0.1}Ga_{0.9}N$ p-type cladding layer 49 can be facilitated.

Furthermore, when the In composition of the quantum well layer is relatively small, the quantum well layer is not substantially evaporated even if the evaporation prevention layer 47 is not provided. Thus, even if the evaporation prevention layer 47 is not provided in such a case, the characteristics of the gallium nitride type semiconductor laser device according to the present example will not be lost or deteriorated.

Referring to FIG. 3, a method for producing the above-described gallium nitride type semiconductor laser device will now be described. In the following, an MOCVD method is employed. However, any other vapor phase growth method with which GaN can be epitaxially grown may alternatively be used, e.g., an MBE method or an HVPE method.

First, the GaN buffer layer 42 is grown to be about 35 nm in thickness at a growth temperature of about 550° C., using TMG and $NH_3$ as source materials, on the sapphire substrate 41 having a c-plane as a top surface thereof which has been positioned in a preselected growth oven.

Then, the growth temperature is increased to about 1050° C., and the Si-doped n-GaN n-type contact layer 43 is grown to be about 3 μm in thickness, using TMG, $NH_3$ and $SiH_4$ as source materials. Then, TMA is added to the source materials, and the Si-doped n-$Al_{0.1}Ga_{0.9}N$ n-type cladding layer 44 is grown to be about 0.7 μm in thickness while maintaining the growth temperature at about 1050° C. Then, TMA is removed from the source materials, and the Si-doped n-GaN guide layer 45 is grown to be about 0.05 μm in thickness while maintaining the growth temperature at about 1050° C.

Next, the growth temperature is reduced to about 750° C., and an $In_{0.2}Ga_{0.8}N$ quantum well layer (thickness: about 5 nm), an $In_{0.05}Ga_{0.9}N$ barrier layer (thickness: about 5 nm), an $In_{0.2}Ga_{0.8}N$ quantum well layer (thickness: about 5 nm) an $In_{0.05}Ga_{0.95}N$ barrier layer (thickness: about 5 nm) and an $In_{0.2}Ga_{0.8}N$ quantum well layer (thickness: about 5 nm) are grown in this order, using TMG, $NH_3$ and TMI as source materials, thereby providing the multiquantum well structure active layer 46 (total thickness: about 25 nm). Then, the $Al_{0.2}Ga_{0.8}N$ evaporation prevention layer 47 is grown to be about 10 nm in thickness, using TMG, TMA and $NH_3$ as source materials, while maintaining the growth temperature at about 750° C. Next, the growth temperature is increased again to about 1050° C., and the Mg-doped p-GaN guide layer 48 is grown to be about 0.05 μm in thickness, using TMG, $NH_3$ and $Cp_2Mg$ as source materials.

After the above-described crystal growth steps, the resulting wafer is taken out of the growth oven, and the $SiO_2$ insulation film 53 having a thickness of about 200 nm is formed as a current blocking layer on the surface of the Mg-doped p-GaN guide layer 48. Thereafter, using ordinary photolithography and wet etching techniques, the $SiO_2$ insulation film 53 is wet-etched with fluorine so as to form a striped groove having a width of about 1.0 μm.

Then, the wafer is again positioned in the growth oven, and the Mg-doped p-$Al_{0.1}Ga_{0.9}N$ p-type cladding layer 49 is grown to be about 0.7 μm in thickness with a growth temperature of about 1050° C., using TMG, TMA, $NH_3$ and $Cp_2Mg$ as source materials. Then, TMA is removed from the source materials, and the Mg-doped p-GaN p-type contact layer 50 is grown to be about 0.2 μm in thickness while maintaining the growth temperature at about 1050° C. Thus, a gallium nitride type epitaxial wafer is produced. The p-$Al_{0.1}Ga_{0.9}N$ p-type cladding layer 49 and the p-GaN p-type contact layer 50 are formed in a ridge structure centered along the striped groove having a width of about 1.0 μm.

Then, the wafer is annealed in a nitrogen gas atmosphere at about 800° C., so as to reduce the resistance of the Mg-doped p-type layers.

Thereafter, using ordinary photolithography and dry etching techniques, an etching process is performed to remove portions of the $SiO_2$ insulation film 53 and the other layers thereunder where the p-$Al_{0.1}Ga_{0.9}N$ p-type cladding layer 49 and the p-GaN p-type contact layer 50 are not provided so that the n-GaN n-type contact layer 43 is exposed. Thus, a striped mesa structure is provided having a width of about 200 μm and including the ridge structure of the p-$Al_{0.1}Ga_{0.9}N$ p-type cladding layer 49 and the p-GaN p-type contact layer 50. The striped ridge structure of the p-$Al_{0.1}Ga_{0.9}N$ p-type cladding layer 49 and the p-GaN p-type contact layer 50 is preferably separated by about 3 μm or more from each side of the mesa structure having a width of about 200 μm. In the present example, the striped ridge structure is provided so as to be separated by about 5 μm from a side of the mesa structure on which the n-side electrode 52 is formed. When the striped ridge structure is provided close to the n-side electrode 52 as in this example, the electric resistance and thus the operating voltage is reduced.

Then, the p-side electrode 51 of nickel and gold is formed on the surface of the $SiO_2$ insulation film 53 and the p-GaN p-type contact layer 50. The n-side electrode 52 of titanium and aluminum is formed on the surface of the n-GaN n-type contact layer 43 which has been exposed by the etching process. Thus, a gallium nitride type LD wafer is produced.

Then, the wafer is cleaved along a direction perpendicular to the direction of the ridge stripe so as to provide laser cavity end faces. Thereafter, each of the cleaved wafer pieces is further divided into individual chips. Each chip is mounted on a stem, and the electrodes are respectively connected to lead terminals by wire bonding, thereby producing a gallium nitride type semiconductor laser device.

The produced semiconductor laser device exhibits good laser characteristics, e.g., an oscillation wavelength of about 410 nm and an oscillation threshold current of about 15 mA. Moreover, deterioration is not observed in these characteristics, and it is confirmed that the device effects self-pulsation. When the gallium nitride type semiconductor laser device of this example is used in an optical disk system, a data read error is prevented. Thus, there is provided a gallium nitride type semiconductor laser device which can be put into practical use.

In the present example, the width of the current injection stripe region is about 1.0 μm. However, substantially the same effect can be achieved with any other width of the stripe region in a range between about 0.2 μm and about 1.8 μm.

In the present example, each of the quantum well layers and the barrier layers of the multiquantum well structure active layer 46 has a thickness of about 5 nm. However, these layers need not have the same thickness but may alternatively have different thicknesses. Moreover, substantially the same effect can be achieved as long as each of these layers has a thickness of about 10 nm or less. Furthermore, the multiquantum well structure active layer 46 may alternatively include two or four quantum well layers, or it may alternatively be a single quantum well layer structure active layer.

In the present example, the laser cavity end faces are provided by cleavage. However, a sapphire substrate may sometimes be so hard that it is difficult to be cleaved. In such a case, the laser cavity end faces may alternatively be provided by a dry etching process.

Moreover, since a sapphire substrate, which is an insulator, is used in the present example, the n-side electrode 52 is formed on the surface of the n-GaN n-type contact layer 43 which has been exposed by the etching process. Alternatively, when GaN, SiC, Si, GaAs, or the like, having the n-type conductivity, is used for the substrate, the n-side electrode 52 may be formed on the reverse side of the substrate. In such a case, the etching process for producing a striped mesa structure having a width of about 200 μm may be optional, and the striped ridge structure into which a current is injected may be separated by about 3 μm or more from each end of the semiconductor laser device chip.

Moreover, the p-type and n-type conductivities may be reversed in the above explanation.

EXAMPLE 6

FIG. 4 is a cross-sectional view illustrating a gallium nitride type semiconductor laser device according to Example 6 of the present invention.

Referring to FIG. 4, the gallium nitride type semiconductor laser device includes an insulative GaN substrate 61 having a c-plane as a top surface thereof, an n-GaN n-type contact layer 62, an n-$Al_{0.1}Ga_{0.9}N$ n-type cladding layer 63, an n-GaN guide layer 64, a multiquantum well structure active layer 65 including three $In_{0.2}Ga_{0.8}N$ quantum well layers and four $In_{0.05}Ga_{0.95}N$ barrier layers, a p-GaN guide layer 66, a p-$Al_{0.1}Ga_{0.9}N$ p-type first cladding layer 67, a p-$Al_{0.1}Ga_{0.9}N$ p-type second cladding layer 68, a p-GaN p-type contact layer 69, a p-side electrode 70, an n-side electrode 71 and a Si-doped n-$Al_{0.25}Ga_{0.75}N$ current blocking layer 72.

In the present example, the Si-doped n-$Al_{0.25}Ga_{0.75}N$ layer is used as a current blocking layer. Alternatively, any other semiconductor may be used as long as it has a refractive index less than or equal to that of the Mg-doped p-$Al_{0.1}Ga_{0.9}N$ p-type cladding layer. For example, an AlGaN ternary mixed crystal nitride semiconductor having a different Al composition, an AlGaInN quaternary mixed crystal nitride semiconductor, or a semiconductor other than a nitride semiconductor may be used. However, when a gallium nitride type semiconductor is used for a current blocking layer, the thermal expansion coefficient, the lattice constant and the crystalline structure thereof are similar to those of the other gallium nitride type semiconductors used for the active layer or the cladding layer. Thus, a current blocking layer having a good crystallinity can be formed, thereby improving the reliability of the laser device.

The GaN substrate used in the present example has a lattice constant which is close to that of a gallium nitride type semiconductor material deposited thereon, thereby resulting in a film with good crystallinity. Furthermore, it is relatively easily cleaved, thereby facilitating formation of a laser cavity end face by cleavage. However, the substrate which can be used in the present invention is not limited to a GaN substrate. For example, a sapphire substrate, a SiC substrate, a spinel substrate, a MgO substrate, a Si substrate, a GaAs substrate, or the like, may be used instead of a GaN substrate. When a sapphire substrate is used, in order to reduce the lattice constant difference between the nitride semiconductor and the sapphire substrate, a gallium nitride type semiconductor buffer layer may be provided on the sapphire substrate before depositing the multilayer structure of the semiconductor laser device.

Each of the n-type cladding layer 63 and the p-type cladding layers 67 and 68 may alternatively be made of an AlGaN ternary mixed crystal having an Al composition other than $Al_{0.1}Ga_{0.9}N$. When the Al composition is increased, the energy gap difference and the refractive index difference between the active layer and the cladding layer increases, thereby effectively confining carriers and light within the active layer. This allows for reduction of the oscillation threshold current and improvement of the temperature characteristic. Decreasing the Al composition to such an extent that the confinement of carriers and light is maintained increases the mobility of the carriers in the cladding layers, thereby allowing for reduction of the device resistance of the semiconductor laser device. Moreover, each of these cladding layers may alternatively be made of a quaternary mixed crystal semiconductor, or a mixed crystal semiconductor of more than four elements which further contains one or more additional elements in a small amount. The n-type cladding layer 63 and the p-type cladding layers 67 and 68 need not have the same mixed crystal composition.

Referring to FIG. 4, a method for producing the above-described gallium nitride type semiconductor laser device will now be described. In the following, an MOCVD method is employed. However, any other vapor phase growth method with which GaN can be epitaxially grown may alternatively be used, e.g., an MBE method or an HVPE method.

First, the Si-doped n-GaN n-type contact layer 62 is grown to be about 3 μm in thickness at a growth temperature of about 1050° C., using TMG, $NH_3$ and $SiH_4$ as source materials, on the insulative GaN substrate 61 having a c-plane as a top surface thereof which has been positioned in a preselected growth oven. Then, TMA is added to the source materials, and the Si-doped $Al_{0.1}Ga_{0.9}N$ n-type cladding layer 63 is grown to be about 0.7 μm while maintaining the growth temperature at about 1050° C. Then, the Si-doped n-GaN guide layer 64 is grown to be about 0.05 μm while maintaining the growth temperature at about 1050° C.

Next, the growth temperature is reduced to about 750° C., and an $In_{0.05}Ga_{0.95}N$ barrier layer (thickness: about 5 nm), an $In_{0.2}Ga_{0.8}N$ quantum well layer (thickness: about 5 nm), an $In_{0.05}Ga_{0.95}N$ barrier layer (thickness: about 5 nm), an $In_{0.2}Ga_{0.8}N$ quantum well layer (thickness: about 5 nm), an $In_{0.05}Ga_{0.95}N$ barrier layer (thickness: about 5 nm), an $In_{0.2}Ga_{0.8}N$ quantum well layer (thickness: about 5 nm) and an $In_{0.05}Ga_{0.95}N$ barrier layer (thickness: about 5 nm) are grown in this order, using TMG, $NH_3$ and TMI as source materials, thereby providing the multiquantum well structure active layer 65 (total thickness: about 35 nm).

Next, the growth temperature is increased again to about 1050° C., and the Mg-doped p-GaN guide layer 66 is grown to be about 0.05 μm in thickness, using TMG, $NH_3$ and $Cp_2Mg$ as source materials. Then, TMA is added to the source materials, and the p-$Al_{0.1}Ga_{0.9}N$ p-type first cladding layer 67 is grown to be about 0.2 μm while maintaining the growth temperature at about 1050° C. Then, the Si-doped n-$Al_{0.25}Ga_{0.75}N$ current blocking layer 72 is grown to be about 0.3 μm while maintaining the growth temperature at about 1050° C., using TMG, $NH_3$, TMA and $SiH_4$ as source materials.

After the above-described crystal growth steps, the resulting wafer is taken out of the growth oven and, using ordinary photolithography and dry etching techniques, a dry etching process is performed to remove a portion of the n-$Al_{0.25}Ga_{0.75}$N current blocking layer 72 so as to provide a striped groove having a width of about 1.0 μm which reaches the p-$Al_{0.1}Ga_{0.9}$N p-type first cladding layer 67. The dry etching is stopped before reaching the multiquantum well structure active layer 65 so as to suppress damage to the active layer due to the etching, thereby preventing the reliability of the device from decreasing and the oscillation threshold current value from increasing.

Then, the wafer is again positioned in the growth oven, and the Mg-doped p-$Al_{0.1}Ga_{0.9}$N p-type second cladding layer 68 is grown in the stripe grooves each having a width of about 1.0 μm and substantially over the entire surface of the n-$Al_{0.25}Ga_{0.75}$N current blocking layer 72 with a growth temperature of about 1050° C., using TMG, TMA, $NH_3$ and $Cp_2$Mg as source materials. The Mg-doped p-$Al_{0.1}Ga_{0.9}$N p-type second cladding layer 68 is formed to be about 0.5 μm in thickness. Then, TMA is removed from the source materials, and the Mg-doped p-GaN p-type contact layer 69 is grown to be about 0.2 μm in thickness while maintaining the growth temperature at about 1050° C. Thus, a gallium nitride type epitaxial wafer is produced.

Then, the wafer is annealed in a nitrogen gas atmosphere at about 800° C., so as to reduce the resistance of the Mg-doped p-type layers.

Thereafter, using ordinary photolithography and dry etching techniques, an etching process is performed to remove portions of the p-GaN p-type contact layer 69 and the other layers thereunder where the striped groove having a width of about 1.0 μm are not provided so that the n-GaN n-type contact layer 62 is exposed. Thus, a striped mesa structure are provided to have a width of about 200 μm and include the groove having a width of about 1.0 μm. The striped groove having a width of about 1.0 μm is preferably separated by about 3 μm or more from each side of the mesa structure having a width of about 200 μm. In the present example, the striped groove is provided so as to be separated by about 5 μm from a side of the mesa structure on which the n-side electrode 71 is formed.

Then, the p-side electrode 70 of nickel and gold is formed on the surface of the p-GaN p-type contact layer 69, which is at the top of the mesa structure having a width of about 200 μm. The n-side electrode 71 of titanium and aluminum is formed on the surface of the n-GaN n-type contact layer 62 which has been exposed by the etching process. Thus, a gallium nitride type LD wafer is produced.

Then, the wafer is cleaved along a direction perpendicular to the direction of the groove stripe so as to provide laser cavity end faces, and each of the cleaved wafer pieces is further divided into individual chips. Each chip is mounted on a stem, and the electrodes are respectively connected to lead terminals by wire bonding, thereby producing a gallium nitride type semiconductor laser device.

The produced semiconductor laser device exhibits good laser characteristics, e.g., an oscillation wavelength of about 410 nm and an oscillation threshold current of about 15 mA. Moreover, deterioration is not observed in these characteristics, and it is confirmed that the device effects self-pulsation. When the gallium nitride type semiconductor laser device of this example is used in an optical disk system, a data read error is prevented. Thus, there is provided a gallium nitride type semiconductor laser device which can be put into practical use.

In the present example, the width of each of the striped grooves into which a current is injected is about 1.0 μm. However, substantially the same effect can be achieved with any other width of the stripe region in a range between about 0.2 μm and about 1.8 μm.

In the present example, each of the quantum well layers and the barrier layers of the multiquantum well structure active layer 65 has a thickness of about 5 nm. However, these layers need not have the same thickness but may alternatively have different thicknesses. Moreover, substantially the same effect can be achieved as long as each of these layers has a thickness of about 10 nm or less. Furthermore, the multiquantum well structure active layer 65 may alternatively include two or four quantum well layers, or it may alternatively be a single quantum well layer structure active layer.

In the present example, the laser cavity end faces are provided by cleavage. The laser cavity end faces may alternatively be provided by a dry etching process.

Moreover, since an insulative substrate is used in the present example, the n-side electrode 71 is formed on the surface of the n-GaN n-type contact layer 62 which has been exposed by the etching process. Alternatively, when GaN, SiC, Si, GaAs, or the like, having the n-type conductivity, is used for the substrate, the n-side electrode 71 may be formed on the reverse side of the substrate. In such a case, the etching process for producing a striped mesa structure having a width of about 200 μm may be optional, and the striped groove into which a current is injected may be separated by about 3 μm or more from each end of the semiconductor laser device chip.

Moreover, the p-type and n-type conductivities may be reversed in the above explanation.

In the present example, the p-$Al_{0.1}Ga_{0.9}$N p-type first cladding layer 67 and the p-$Al_{0.1}Ga_{0.9}$N p-type second cladding layer 68 have the same composition. Therefore, the lateral mode laser characteristic of the device is not affected by the remaining thickness of the etched portion of the p-$Al_{0.1}Ga_{0.9}$N p-type first cladding layer 67 which has been etched during the dry etching process for etching a portion of the n-$Al_{0.25}Ga_{0.75}$N current blocking layer 72 to form the striped grooves. This is because the same gallium nitride type semiconductor composition is employed for the p-type cladding layer which is provided in the striped groove. Thus, good laser characteristics can be obtained even when there is variation in the thickness of the unetched portion of the p-$Al_{0.1}Ga_{0.9}$N p-type first cladding layer 67.

Moreover, when it is possible, by controlling the etching rate, to precisely control the remaining thickness of the etched portion of the p-$Al_{0.1}Ga_{0.9}$N p-type first cladding layer 67, the p-$Al_{0.1}Ga_{0.9}$N p-type first cladding layer 67 and the p-$Al_{0.1}Ga_{0.9}$N p-type second cladding layer 68 need not to have the same composition to obtain good laser characteristics without variations.

EXAMPLE 7

Figure 5:
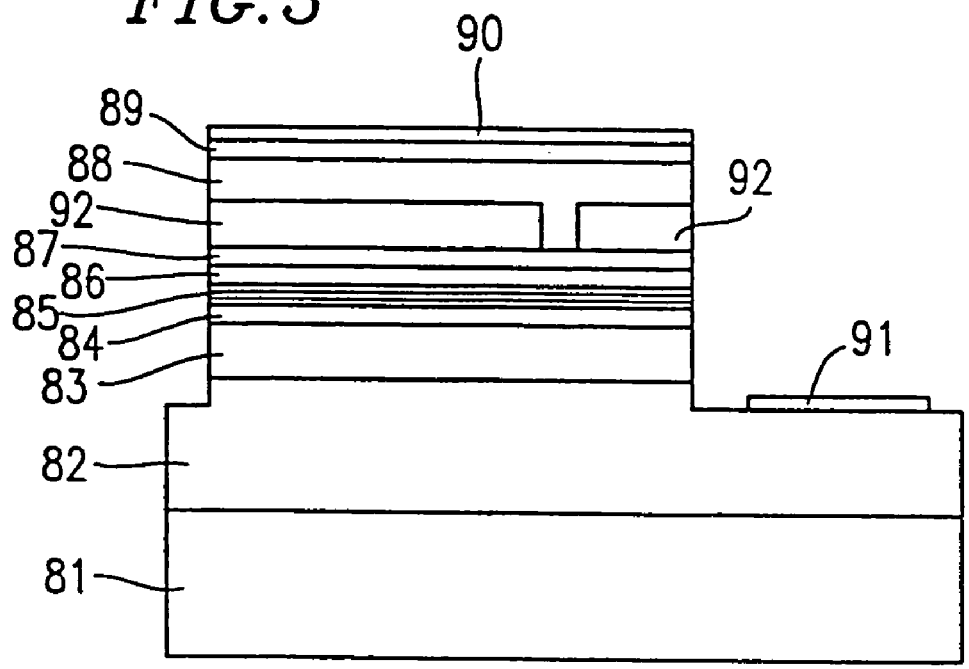
FIG. 5 is a cross-sectional view illustrating a semiconductor laser device according to Example 7 of the present invention.

FIG. 5 is a cross-sectional view illustrating a gallium nitride type semiconductor laser device according to Example 7 of the present invention.

Referring to FIG. 5, the gallium nitride type semiconductor laser device includes an insulative GaN substrate 81 having a c-plane as a top surface thereof, an n-GaN n-type contact layer 82, an n-$Al_{0.1}Ga_{0.9}$N n-type cladding layer 83, an n-GaN guide layer 84, a multiquantum well structure active layer 85 including two $In_{0.2}Ga_{0.8}$N quantum well layers and three $In_{0.05}Ga_{0.95}$N barrier layers, a p-GaN guide layer 86, a p-$Al_{0.1}Ga_{0.9}$N p-type etching stopping layer 87, a p-$Al_{0.1}Ga_{0.9}$N p-type cladding layer 88, a p-GaN p-type contact layer 89, a p-side electrode 90, an n-side electrode 91 and a Si-doped n-$In_{0.25}Ga_{0.75}$N current blocking layer 92.

In the present example, the Si-doped n-In$_{0.25}$Ga$_{0.75}$N layer is used as a current blocking layer. Alternatively, any other semiconductor may be used as long as it has an energy gap less than or equal to that of the active layer. For example, an InGaN ternary mixed crystal nitride semiconductor having a different In composition, an AlGaInN quaternary mixed crystal nitride semiconductor, or a semiconductor other than a nitride semiconductor such as a gallium arsenide type semiconductor, an indium phosphide type semiconductor, a II–VI group semiconductor, a IV group semiconductor, or the like, may be used. However, when a gallium nitride type semiconductor is used for a current blocking layer, the thermal expansion coefficient, the lattice constant and the crystalline structure thereof are similar to those of the other gallium nitride type semiconductors used for the active layer or the cladding layer. Therefore, a current blocking layer having a good crystallinity can be formed, thereby improving the reliability of the laser device.

Referring to FIG. 5, a method for producing the above-described gallium nitride type semiconductor laser device will now be described. In the following, an MOCVD method is employed. However, any other vapor phase growth method with which GaN can be epitaxially grown may alternatively be used, e.g., an MBE method or an HVPE method.

First, the Si-doped n-GaN n-type contact layer 82 is grown to be about 3 μm in thickness at a growth temperature of about 1050° C., using TMG, NH$_3$ and SiH$_4$ as source materials, on the insulative GaN substrate 81 having a c-plane as a top surface thereof which has been positioned in a preselected growth oven. Then, TMA is added to the source materials, and the Si-doped n-Al$_{0.1}$Ga$_{0.9}$N n-type cladding layer 83 is grown to be about 0.7 μm in thickness while maintaining the growth temperature at about 1050° C. Then, TMA is removed from the source materials, and the Si-doped p-GaN guide layer 84 is grown to be about 0.05 μm in thickness while maintaining the growth temperature at about 1050° C.

Next, the growth temperature is reduced to about 750° C., and an In$_{0.05}$Ga$_{0.95}$N barrier layer (thickness: about 5 nm), an In$_{0.2}$Ga$_{0.8}$N quantum well layer (thickness: about 5 nm), an In$_{0.05}$Ga$_{0.95}$N barrier layer (thickness: about 5 nm), an In$_{0.2}$Ga$_{0.8}$N quantum well layer (thickness: about 5 nm) and an In$_{0.05}$Ga$_{0.95}$N barrier layer (thickness: about 5 nm) are grown in this order, using TMG, NH$_3$ and TMI as source materials, thereby providing the multiquantum well structure active layer 85 (total thickness: about 25 nm).

Next, the growth temperature is increased again to about 1050° C., and the Mg-doped p-GaN guide layer 86 is grown to be about 0.05 μm in thickness, using TMG, NH$_3$ and Cp$_2$Mg as source materials. Then, TMA is added to the source materials, and the Mg-doped p-Al$_{0.1}$Ga$_{0.9}$N p-type etching stopping layer 87 is grown to be about 0.05 μm while maintaining the growth temperature at about 1050° C. Then, the growth temperature is reduced to about 750° C., and the Si-doped n-In$_{0.25}$Ga$_{0.75}$N current blocking layer 92 is grown to be about 0.3 μm, using TMG, NH$_3$, TMI and SiH$_4$ as source materials.

After the above-described crystal growth steps, the resulting wafer is taken out of the growth oven and, using ordinary photolithography and dry etching techniques, a dry etching process is performed to remove a portion of the n-In$_{0.25}$Ga$_{0.75}$N current blocking layer 92 so as to provide a striped groove having a width of about 1.0 μm which reaches the p-Al$_{0.1}$Ga$_{0.9}$N p-type etching stopping layer 87. In this process, Al atoms appear on the exposed surface when the etching reaches the p-Al$_{0.05}$Ga$_{0.95}$N etching stopping layer 87. Thus, the etching process can be stopped upon detection of the Al atoms by element analysis, thereby precisely controlling the etching depth.

Then, the wafer is again positioned in the growth oven, and the Mg-doped p-Al$_{0.1}$Ga$_{0.9}$N p-type cladding layer 88 is grown in the stripe groove having a width of about 1.0 μm and substantially over the entire surface of the n-In$_{0.25}$Ga$_{0.75}$N current blocking layer 92 with a growth temperature of about 1050° C., using TMG, TMA, NH$_3$ and Cp$_2$Mg as source materials. The Mg-doped p-Al$_{0.1}$Ga$_{0.9}$N p-type cladding layer 88 is formed to be about 0.7 μm in thickness. Then, TMA is removed from the source materials, and the Mg-doped p-GaN p-type contact layer 89 is grown to be about 0.2 μm in thickness while maintaining the growth temperature at about 1050° C. Thus, a gallium nitride type epitaxial wafer is produced.

Then, the wafer is annealed in a nitrogen gas atmosphere at about 800° C., so as to reduce the resistance of the Mg-doped p-type layers.

Thereafter, using ordinary photolithography and dry etching techniques, an etching process is performed to remove portions of the p-GaN p-type contact layer 89 and the other-layers thereunder where the striped groove having a width of about 1.0 μm are not provided so that the n-GaN n-type contact layer 82 is exposed. Thus, a striped mesa structures are provided to have a width of about 200 μm and include the groove having a width of about 1.0 μm. The striped groove having a width of about 1.0 μm is preferably separated by about 3 μm or more from each side of the mesa structure having a width of about 200 μm. In the present example, the striped groove is provided so as to be separated by about 5 μm from a side of the mesa structure on which the n-side electrode 91 is formed.

Then, the p-side electrode 90 of nickel and gold is formed on the surface of the p-GaN p-type contact layer 89, which is at the top of the mesa structure having a width of about 200 μm. The n-side electrode 91 of titanium and aluminum is formed on the surface of the n-GaN n-type contact layer 82 which has been exposed by the etching process. Thus, a gallium nitride type LD wafer is produced.

Then, the wafer is cleaved along a direction perpendicular to the direction of the groove stripe so as to provide laser cavity end faces and each of the cleaved wafer pieces is further divided into individual chips. Each chip is mounted on a stem, and the electrodes are respectively connected to lead terminals by wire bonding, thereby producing a gallium nitride type semiconductor laser device.

The produced semiconductor laser device exhibits good laser characteristics, e.g., an oscillation wavelength of about 410 nm and an oscillation threshold current of about 18 mA. Moreover, deterioration is not observed in these characteristics, and it is confirmed that the device effects self-pulsation. When the gallium nitride type semiconductor laser device of this example is used in an optical disk system, a data read error is prevented. Thus, there is provided a gallium nitride type semiconductor laser device which can be put into practical use.

In the present example, the width of each of the striped grooves into which a current is injected is about 1.0 μm. However, substantially the same effect can be achieved with any other width of the stripe region in a range between about 0.2 μm and about 1.8 μm.

In the present example, the p-Al$_{0.1}$Ga$_{0.9}$N p-type etching stopping layer 87 and the p-Al$_{0.1}$Ga$_{0.9}$N p-type cladding layer 88 have the same composition. Alternatively, these layers may have different compositions, respectively. Moreover, the Al composition of the p-Al$_{0.1}$Ga$_{0.9}$N p-type etching stopping layer 87 is not limited to that illustrated in this example. Any other semiconductor may be used as long as it allows for determination of the etching depth. When the Al composition is less than that of the p-type cladding layer 88 and greater than that of the p-GaN guide layer 86, the energy gap of the p-type etching stopping layer 87 is between that of the p-type cladding layer 88 and that of the p-GaN guide layer 86. This causes an energy gradient for injecting holes from the p-type cladding layer 88 into the p-GaN guide layer 86, thereby facilitating the injection.

In the present example, the p-$Al_{0.1}Ga_{0.9}N$ p-type etching stopping layer 87 is deposited on the p-GaN guide layer 86. Alternatively, the p-$Al_{0.1}Ga_{0.9}N$ p-type etching stopping layer 87 may be deposited in the p-GaN guide layer 86.

EXAMPLE 8

Figure 6:
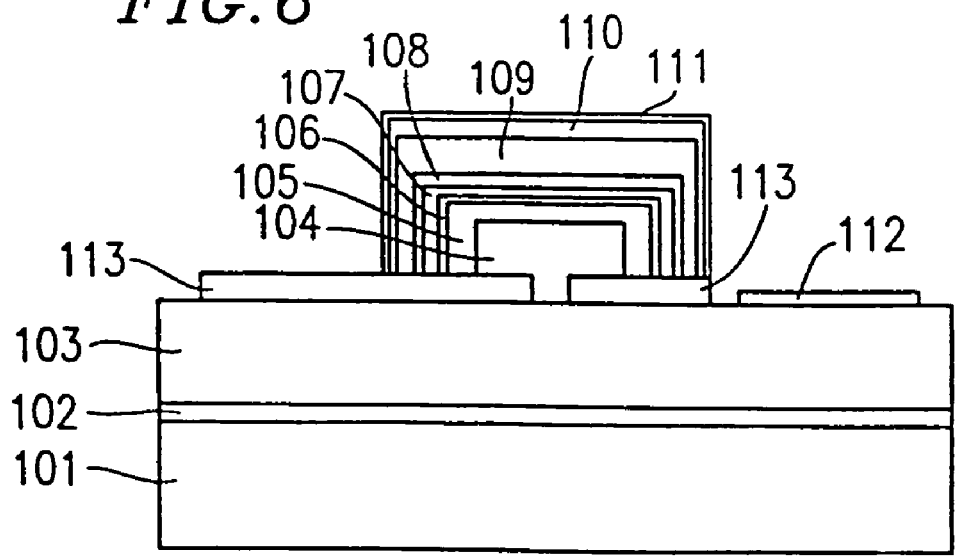
FIG. 6 is a cross-sectional view illustrating a semiconductor laser device according to Example 8 of the present invention.

FIG. 6 is a cross-sectional view illustrating a gallium nitride type semiconductor laser device according to Example 8 of the present invention.

Referring to FIG. 6, the gallium nitride type semiconductor laser device includes a sapphire substrate 101 having a c-plane as a top surface thereof, a GaN buffer layer 102, an n-GaN n-type contact layer 103, an n-$Al_{0.1}Ga_{0.9}N$ n-type cladding layer 104, an n-GaN guide layer 105, a multiquantum well structure -active layer 106 including two $In_{0.2}Ga_{0.8}N$ quantum well layers and a single $In_{0.05}Ga_{0.95}N$ barrier layer, an $Al_{0.2}Ga_{0.8}N$ evaporation prevention layer 107, a p-GaN guide layer 108, a p-$Al_{0.1}Ga_{0.9}N$ p-type cladding layer 109, a p-GaN p-type contact layer 110, a p-side electrode 111, an n-side electrode 112 and a $SiO_2$ insulation film 113.

Referring to FIG. 6, a method for producing the above-described gallium nitride type semiconductor laser device will now be described. In the following, an MOCVD method is employed. However, any other vapor phase growth method with which GaN can be epitaxially grown may alternatively be used, e.g., an MBE method or an HVPE method.

First, the GaN buffer layer 102 is grown to be about 35 nm in thickness at a growth temperature of about 550° C., using TMG and $NH_3$ as source materials, on the sapphire substrate 101 having a c-plane as a top surface thereof which has been positioned in a preselected growth oven.

Then, the growth temperature is increased to about 1050° C., and the Si-doped n-GaN n-type contact layer 103 is grown to be about 3 μm in thickness, using TMG, $NH_3$ and $SiH_4$ as source materials.

After the above-described crystal growth steps, the resulting wafer is taken out of the growth oven, and the $SiO_2$ insulation film 113 having a thickness of about 200 nm is formed as a current blocking layer on the surface of the Si-doped n-GaN n-type contact layer 103. Moreover, using ordinary photolithography and wet etching techniques, the $SiO_2$ insulation film 113 is wet-etched with fluorine so as to form a striped groove having a width of about 1.0 μm.

Then, the wafer is again positioned in the growth oven, and the Si-doped n-$Al_{0.1}Ga_{0.9}N$ n-type cladding layer 104 is grown to be about 0.7 μm in thickness while maintaining the growth temperature at about 1050° C., using TMG, TMA, $NH_3$ and $SiH_4$ as source materials. Then, TMA is removed from the source materials, and the Si-doped n-GaN guide layer 105 is grown to be about 0.05 μm in thickness while maintaining the growth temperature at about 1050° C.

Next, the growth temperature is reduced to about 750° C., and an $In_{0.2}Ga_{0.8}N$ quantum well layer (thickness: about 5 nm), an $In_{0.05}Ga_{0.95}N$ barrier layer (thickness: about 5 nm) and an $In_{0.2}Ga_{0.8}N$ quantum well layer (thickness: about 5 nm) are grown in this order, using TMG, $NH_3$ and TMI as source materials, thereby providing the multiquantum well structure active layer 106 (total thickness: about 15 nm). Then, the $Al_{0.2}Ga_{0.8}N$ evaporation prevention layer 107 is grown to be about 10 nm in thickness, using TMG, TMA and $NH_3$ as source materials, while maintaining the growth temperature at about 750° C. Next, the growth temperature is increased again to about 1050° C., and the Mg-doped p-GaN guide layer 108 is grown to be about 0.05 μm in thickness, using TMG, $NH_3$ and $Cp_2Mg$ as source materials. Then, TMA is added to the source materials, and the Mg-doped p-$Al_{0.1}Ga_{0.9}N$ p-type cladding layer 109 is grown to be about 0.7 μm in thickness while maintaining the growth temperature at about 1050° C. Then, TMA is removed from the source materials, and the Mg-doped p-GaN p-type contact layer 110 is grown to be about 0.2 μm in thickness while maintaining the growth temperature at about 1050° C. Thus, a gallium nitride type epitaxial wafer is produced. In the above process, the n-$Al_{0.1}Ga_{0.9}N$ n-type cladding layer 104, the n-GaN guide layer 105, the multiquantum well structure active layer 106, the $Al_{0.2}Ga_{0.8}N$ evaporation prevention layer 107, the p-GaN guide layer 108, the p-$Al_{0.1}Ga_{0.9}N$ p-type cladding layer 109 and p-GaN p-type contact layer 110 are each formed in a ridge structure centered along the striped groove having a width of about 1.0 μm.

Then, the wafer is annealed in a nitrogen gas atmosphere at about 800° C., so as to reduce the resistance of the Mg-doped p-type layers.

Thereafter, using ordinary photolithography and wet etching techniques, an etching process is performed to remove portions of the $SiO_2$ insulation film 113 on which the ridge structure is not formed in a striped pattern having a width of about 100 μm until the n-GaN n-type contact layer 103 is exposed.

Then, the p-side electrode 111 of nickel and gold is formed on the surface of the p-GaN p-type contact layer 110. The n-side electrode 112 of titanium and aluminum is formed on the surface of the n-GaN n-type contact layer 103 which has been exposed by the etching process. Thus, a gallium nitride type LD wafer is produced.

Then, the wafer is cleaved along a direction perpendicular to the direction of the ridge stripe so as to provide laser cavity end faces, and each of the cleaved wafer pieces is further divided into individual chips. Each chip is mounted on a stem, and the electrodes are respectively connected to lead terminals by wire bonding, thereby producing a gallium nitride type semiconductor laser device.

The produced semiconductor laser device exhibits good laser characteristics, e.g., an oscillation wavelength of about 410 nm and an oscillation threshold current of about 18 mA. Moreover, deterioration is not observed in these characteristics, and it is confirmed that the device effects self-pulsation. When the gallium nitride type semiconductor laser device of this example is used in an optical disk system, a data read error is prevented. Thus, there is provided a gallium nitride type semiconductor laser device which can be put into practical use.

In the present example, the width of the current injection stripe region is about 1.0 μm. However, substantially the same effect can be achieved with any other width of the stripe region in a range between about 0.2 μm and about 1.8 μm.

Moreover, in the present example, a gallium nitride type semiconductor layer having the n-type conductivity is provided on the sapphire substrate 101, and then a gallium nitride type semiconductor layer having the p-type conductivity is provided thereon. Alternatively, the p-type and n-type conductivities may be reversed. In such a case, the $Al_{0.1}Ga_{0.9}N$ cladding layer which is deposited after forming the current blocking layer has the p-type conductivity, and thus, the electric resistance is increased. Therefore, the current constricted by the current blocking layer is prevented from spreading in the p-$Al_{0.1}Ga_{0.9}N$ p-type cladding layer, thereby reducing the oscillation threshold current value.

EXAMPLE 9

FIG. 7 is a cross-sectional view illustrating a gallium nitride type semiconductor laser device according to Example 9 of the present invention.

Referring to FIG. 7, the gallium nitride type semiconductor laser device includes a sapphire substrate 121 having a c-plane as a top surface thereof, a GaN buffer layer 122, an p-GaN p-type contact layer 123, a p-$In_{0.05}Ga_{0.95}N$ etching stopping layer 124, a p-$Al_{0.1}Ga_{0.9}N$ p-type cladding layer 125, an p-GaN guide layer 126, a multiquantum well structure active layer 127 including two $In_{0.2}Ga_{0.8}N$ quantum well layers and three $In_{0.05}Ga_{0.95}N$ barrier layers, a n-GaN guide layer 128, an n-$Al_{0.1}Ga_{0.9}N$ n-type cladding layer 129, a n-GaN n-type contact layer 130, a p-side electrode 131, an n-side electrode 132 and a Si-doped n-$Al_{0.25}Ga_{0.75}N$ current blocking layer 133.

In the present example, the Si-doped n-$Al_{0.25}Ga_{0.75}N$ layer is used as a current blocking layer. Alternatively, any other semiconductor may be used as long as it has a refractive-index less than or equal to that of the Mg-doped p-$Al_{0.1}Ga_{0.9}N$ p-type cladding layer. For example, an AlGaN ternary mixed crystal nitride semiconductor having a different Al composition, an AlGaInN quaternary mixed crystal nitride semiconductor, or a semiconductor other than a nitride semiconductor may be used. However, when a gallium nitride type semiconductor is used for a current blocking layer, the thermal expansion coefficient, the lattice constant and the crystalline structure thereof are similar to those of the other gallium nitride type semiconductors used for the active layer or the cladding layer. Therefore, a current blocking layer having a good crystallinity can be formed, thereby improving the reliability of the laser device.

Referring to FIG. 7, a method for producing the above-described gallium nitride type semiconductor laser device will now be described. In the following, an MOCVD method is employed. However, any other vapor phase growth method with which GaN can be epitaxially grown may alternatively be used, e.g., an MBE method or an HVPE method.

First, the GaN buffer layer 122 is grown to be about 35 nm in thickness at a growth temperature of about 550° C., using TMG and $NH_3$ as source materials, on the sapphire substrate 121 having a c-plane as a surface thereof which has been positioned in a preselected growth oven.

Then, the growth temperature is increased to about 1050° C., and the Mg-doped p-GaN p-type contact layer 123 is grown to be about 3 μm in thickness, using TMG, $NH_3$ and $Cp_2Mg$ as source materials. Then, the growth temperature is reduced to about 750° C., TMI is added to the source materials, and the Mg-doped p-$In_{0.05}Ga_{0.95}N$ etching stopping layer 124 is grown to be about 0.02 μm in thickness. Then, the growth temperature is increased again to about 1050° C., and the Si-doped n-$Al_{0.25}Ga_{0.75}N$ current blocking layer 133 is grown to be about 0.2 μm in thickness, using TMG, TMA, $NH_3$ and $SiH_4$ as source materials.

After the above-described crystal growth steps, the resulting wafer is taken out of the growth oven and, using ordinary photolithography and dry etching techniques, a dry etching process is performed to remove a portion of the Si-doped n-$Al_{0.25}Ga_{0.75}N$ current blocking layer 133 so as to provide a striped groove having a width of about 1.0 μm. In this process, In atoms appear on the exposed surface when the etching reaches the p-$In_{0.05}Ga_{0.95}N$ etching stopping layer 124. Therefore, the etching process can be stopped upon detection of the In atoms by element analysis, thereby precisely controlling the etching depth.

Then, the wafer is again positioned in the growth oven, and the Mg-doped p-$Al_{0.1}Ga_{0.9}N$ p-type cladding layer 125 is grown to be about 0.7 μm in thickness at a growth temperature of about 1050° C., using TMG, TMA, $NH_3$ and $Cp_2Mg$ as source materials. Then, TMA is removed from the source materials, and the Mg-doped p-GaN guide layer 126 is grown to be about 0.05 μm in thickness while maintaining the growth temperature at about 1050° C.

Next, the growth temperature is reduced to about 750° C., and an $In_{0.05}Ga_{0.95}N$ barrier layer (thickness: about 5 nm), an $In_{0.2}Ga_{0.8}N$ quantum well layer (thickness: about 5 nm), an $In_{0.05}Ga_{0.95}N$ barrier layer (thickness: about 5 nm), an $In_{0.2}Ga_{0.8}N$ quantum well layer (thickness: about 5 nm) and an $In_{0.05}Ga_{0.95}N$ barrier layer (thickness: about 5 nm) are grown in this order, using TMG, $NH_3$ and TMI as source materials, thereby providing the multiquantum well structure active layer 127 (total thickness: about 25 nm). Next, the growth temperature is increased again to about 1050° C., and the Si-doped n-GaN guide layer 128 is grown to be about 0.05 μm in thickness, using TMG, $NH_3$ and $SiH_4$ as source materials. Then, TMA is added to the source materials, and the Si-doped n-$Al_{0.1}Ga_{0.9}N$ n-type cladding layer 129 is grown to be about 0.7 μm in thickness while maintaining the growth temperature at about 1050° C. Then, TMA is removed from the source materials, and the Si-doped n-GaN n-type contact layer 130 is grown to be about 0.2 μm in thickness while maintaining the growth temperature at about 1050° C. Thus, a gallium nitride type epitaxial wafer is produced.

Then, the wafer is annealed in a nitrogen gas atmosphere at about 800° C., so as to reduce the resistance of the Mg-doped p-type layers.

Thereafter, using ordinary photolithography and dry etching techniques, an etching process is performed to remove portions of the n-GaN n-type contact layer 130 on which the striped groove having a width of about 1.0 μm are not formed until the p-GaN p-type contact layer 123 is exposed. Thus, a striped mesa structure is provided to have a width of about 200 μm and include the groove having a width of about 1.0 μm. The striped groove having a width of about 1.0 μm is preferably separated by about 3 μm or more from each side of the mesa structure having a width of about 200 μm. In the present example, the striped groove is provided so as to be separated by about 5 μm from a side of the mesa structure on which the p-side electrode 131 is formed.

Then, the n-side electrode 132 of titanium and aluminum is formed on the surface of the n-GaN n-type contact layer 130 which is at the top of the mesa structure having a width of about 200 μm. The p-side electrode 131 of nickel and gold is formed on the surface of the p-GaN p-type contact layer 123 which has been exposed by the etching process. Thus, a gallium nitride type LD wafer is produced.

Then, the wafer is cleaved along a direction perpendicular to the direction of the ridge stripe so as to provide laser cavity end faces, and each of the cleaved wafer pieces is further divided into individual chips. Each chip is mounted on a stem, and the electrodes are respectively connected to lead terminals by wire bonding, thereby producing a gallium nitride type semiconductor laser device.

The produced semiconductor laser device exhibits good laser characteristics, e.g., an oscillation wavelength of about 410 nm and an oscillation threshold current of about 15 mA. Moreover, deterioration is not observed in these characteristics, and it is confirmed that the device effects self-pulsation. When the gallium nitride type semiconductor laser device of this example is used in an optical disk system, a data read error is prevented. Thus, there is provided a gallium nitride type semiconductor laser device which can be put into practical use.

In the present example, the width of the current injection stripe region is about 1.0 µm. However, substantially the same effect can be achieved with any other width of the stripe region in a range between about 0.2 µm and about 1.8 µm.

In the present example, the p-$In_{0.05}Ga_{0.95}N$ etching stopping layer 124 is provided between the p-GaN p-type contact layer 123 and the p-$Al_{0.1}Ga_{0.9}N$ p-type cladding layer 125. Alternatively, the p-$In_{0.05}Ga_{0.95}N$ etching stopping layer 124 may be provided in the p-$Al_{0.1}Ga_{0.9}N$ p-type cladding layer 125.

Moreover, in the present example, a gallium nitride type semiconductor layer having the p-type conductivity is provided on the sapphire substrate 121, and then a gallium nitride type semiconductor layer having the n-type conductivity is provided thereon. Alternatively, the p-type and n-type conductivities may be reversed. In such a case, the active layer is formed on a gallium nitride type semiconductor having the n-type conductivity which is generally of a better quality than a gallium nitride type semiconductor having the p-type conductivity, thus improving the reliability of the device.

EXAMLE 10

A gallium nitride type semiconductor laser device according to Example 10 of the present invention is produced in substantially the same manner as that in Example 9, except that a Mg-doped p-$Al_{0.1}Ga_{0.9}N$ layer is used as an etching stopping layer and a Si-doped n-$In_{0.25}Ga_{0.75}N$ layer having a thickness of about 0.2 µm is used as a current blocking layer. A portion of the Si-doped n-$In_{0.25}Ga_{0.75}N$ current blocking layer is etched so as to provide a striped groove having a width of about 1.0 µm. In this process, Al atoms appear on the exposed surface when etching reaches the p-$Al_{0.1}Ga_{0.9}N$ etching stopping layer. Therefore, the etching process can be stopped upon detection of the Al atoms by element analysis, thereby precisely controlling the etching depth.

The produced semiconductor laser device exhibits good laser characteristics, e.g., an oscillation wavelength of about 410 nm and an oscillation threshold current of about 18 mA. Moreover, deterioration is not observed in these characteristics, and it is confirmed that the device effects self-pulsation. In the present example, light generated by the active layer is absorbed by the Si-doped n-$In_{0.25}Ga_{0.75}N$ current blocking layer provided outside the current injection stripe region. The spreading of the lateral mode of the laser light is stabilized due to this light absorption by the current blocking layer, thereby allowing laser light of a single lateral mode to be obtained with good reproducibility.

In the present example, the Si-doped n-$In_{0.25}Ga_{0.75}N$ layer is used as a current blocking layer. Alternatively, any other semiconductor may be used as long as it has an energy gap less than or equal to that of the active layer. For example, an InGaN ternary mixed crystal nitride semiconductor having a different In composition, an AlGaInN quaternary mixed crystal nitride semiconductor, or a semiconductor other than a nitride semiconductor such as a gallium arsenide type semiconductor, an indium phosphide type semiconductor, a II–VI group semiconductor, a IV group semiconductor, or the like, may be used. However, when a gallium nitride type semiconductor is used for a current blocking layer, the thermal expansion coefficient, the lattice constant and the crystalline structure thereof are similar to those of the other gallium nitride type semiconductors used for the active layer or the cladding layer. Therefore, a current blocking layer having a good crystallinity can be formed, thereby improving the reliability of the laser device.

As described above, in the gallium nitride type semiconductor laser device of the present invention, a current is injected into a stripe region having a width smaller than that of the active layer. The width of the current injection stripe region is preferably in a range between about 0.2 µm and about 1.8 µm. As a result, a portion of the active layer existing in the area outside the stripe region where the laser light is spreading can absorb the laser light. Thus, the portion of the active layer outside the current injection stripe region functions as a saturable absorbing layer, thereby obtaining the self-pulsation characteristic.

Even when the width of the stripe region is small as in the present invention, there is little current spreading since a gallium nitride type semiconductor material has a large electric resistance value. Thus, a gallium nitride type semiconductor laser device with a low oscillation threshold current value and good laser oscillation characteristics can be obtained.

Moreover, when the width of the stripe region is reduced as in the present invention, the number of defects within the region is reduced, thereby preventing deterioration of the laser characteristics and improving the reliability of the device.

Thus, the present invention realizes a gallium nitride type semiconductor laser device with satisfactory laser oscillation characteristics which can be used for an optical disk and which does not cause an error during a data read operation.

Various other modifications will be apparent to, and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gallium nitride type semiconductor laser device, comprising:

a substrate; and a layered structure formed on the substrate, the layered structure at least including an active layer of a nitride type semiconductor which is interposed between a pair of nitride type semiconductor layers each functioning as a cladding layer or a guide layer, wherein:

the width of a stripe region through which a current is injected to the active layer is in a range between about 0.2 µm and 1.8 µm, the width of the stripe region is smaller than a width of the active layer, the gallium nitride type semiconductor laser device has a laser cavity end face formed along a direction perpendicular to the stripe, and the substrate is sapphire.

2. A gallium nitride type semiconductor laser device according to claim 1, wherein the laser cavity end face is formed by cleavage.

3. A gallium nitride type semiconductor laser device according to claim 1, wherein the laser cavity end face is formed by dry etching.

4. A gallium nitride type semiconductor laser device, comprising:

a substrate; and a layered structure formed on the substrate, the layered structure at least including an active layer of a nitride type semiconductor which is interposed between a pair of nitride type semiconductor layers each functioning as a cladding layer or a guide layer, wherein:

the width of a stripe region through which a current is injected to the active layer is in a range between about 0.2 $\mu$m and 1.8 $\mu$m, to width of the stripe region is smaller than a width of the active layer the gallium nitride type semiconductor laser device has a laser cavity end face formed along a direction perpendicular to the stripe, and the substrate is GaN or SiC.

5. A gallium nitride type semiconductor laser device according to claim 4, wherein the substrate has an n-type conductivity.

6. A gallium nitride type semiconductor laser device according to claim 4, wherein the laser cavity end face is formed by cleavage.

* * * * *